United States Patent
Abe et al.

(10) Patent No.: US 9,853,063 B2
(45) Date of Patent: Dec. 26, 2017

(54) DISPLAY DEVICE

(71) Applicant: Japan Display Inc., Minato-ku (JP)

(72) Inventors: Hiroyuki Abe, Tokyo (JP); Takayuki Suzuki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/189,211

(22) Filed: Jun. 22, 2016

(65) Prior Publication Data
US 2017/0047348 A1   Feb. 16, 2017

(30) Foreign Application Priority Data

Aug. 11, 2015 (JP) ................. 2015-159170

(51) Int. Cl.
*H01L 27/12* (2006.01)
*G02F 1/1362* (2006.01)

(52) U.S. Cl.
CPC ...... *H01L 27/124* (2013.01); *G02F 1/136209* (2013.01)

(58) Field of Classification Search
CPC .................. H01L 27/124; G02F 1/136209
USPC .......................................................... 257/72
See application file for complete search history.

(56) References Cited

U.S. PATENT DOCUMENTS

2004/0218111 A1* 11/2004 Mochizuki ........ G02F 1/136209
                                                         349/44
2007/0170506 A1    7/2007 Onogi et al.

FOREIGN PATENT DOCUMENTS

JP         2007-201073        8/2007

* cited by examiner

*Primary Examiner* — Marc Armand
*Assistant Examiner* — Warren H Kilpatrick
(74) *Attorney, Agent, or Firm* — Oblon, McClelland, Maier & Neustadt, L.L.P.

(57) ABSTRACT

Even when a light shielding film is provided between a transistor and a substrate, a threshold voltage of the transistor can be prevented or suppressed from being shifted. A display device includes light shielding films provided between a substrate and a semiconductor layer of a transistor including a gate electrode and the semiconductor layer. The semiconductor layer includes a source region and a drain region. Both of the light shielding films overlap the semiconductor layer when seen in a plan view, and are spaced apart from each other in a direction.

7 Claims, 18 Drawing Sheets

DISPLAY DEVICE

CROSS-REFERENCE TO RELATED APPLICATION

The present application claims priority from Japanese Patent Application No. 2015-159170 filed on Aug. 11, 2015, the content of which is hereby incorporated by reference into this application.

TECHNICAL FIELD OF THE INVENTION

The present invention relates to a display device, and relates to a technique effectively applied to, for example, a display device including a transistor provided on a substrate.

BACKGROUND OF THE INVENTION

In a display device such as a liquid crystal display device, for example, a transistor including a thin film transistor (TFT) for pixel selection is provided in each of a plurality of pixels arranged in a matrix form on a substrate such as a glass substrate.

When light is irradiated onto the transistor provided on the substrate as described above, a light leakage current flows in the transistor so that the quality of an image displayed in the display region is reduced. Therefore, a light shielding film for shielding the light from the backlight may be provided between the transistor and the substrate in order to prevent the flow of the light leak current by the irradiation of light from a backlight incident from a back side of the substrate onto the transistor provided on the substrate.

For example, Japanese Patent Application Laid-Open Publication No. 2007-201073 (Patent Document 1) describes a technique of forming a metal layer having a function of shielding a thin film transistor from the light on the substrate side such as a glass substrate or others on the substrate in a display device.

SUMMARY OF THE INVENTION

As described above, in the display region, the light shielding film is provided between the transistor and the substrate. On the other hand, in a peripheral region (frame region) outside the display region, a light shielding tape is provided, for example, between the backlight and the substrate so that each of a plurality of transistors provided in the frame region is not irradiated with light from the backlight incident from the back side of the substrate.

However, for example, when the width of the frame region is reduced, it is difficult to arrange the light shielding tape in the frame region when seen in a plan view. Alternatively, when the light shielding tape is arranged in the frame region when seen in a plan view, the transistor arranged in the frame region is irradiated with light from the backlight incident in a direction inclined to a front surface of the substrate, so that a light leakage current flows, and the quality of an image displayed in the display region is reduced.

In the transistor provided in the display region, a double gate structure in which channels are arranged in series is used to reduce the leakage. In the transistor provided in the peripheral region (frame region), a single gate structure may be used to reduce the area. In the transistor having the single gate structure, a light shielding film is provided between the transistor and the substrate. When light from the backlight incident from the back surface side of the substrate is blocked by the light shielding film, a threshold voltage of the transistor is shifted so that the quality of a display image may be reduced.

A problem is also a common for the transistor provided in the display region, the problem causing more shift of the threshold voltage of the transistor in the provision of the light shielding film between the transistor and the substrate than no provision of the light shielding film between the transistor and the substrate.

SUMMARY OF THE INVENTION

The present invention has been made to solve the problem of the conventional technique as described above, and an object of the present invention is to provide a display device capable of preventing or suppressing a shift of a threshold voltage of a transistor in provision of a light shielding film between the transistor and a substrate more than no provision of the light shielding film between the transistor and the substrate.

The typical ones of the inventions disclosed in the present application will be briefly described as follows.

A display device according to an aspect of the present invention includes: a substrate; a plurality of pixels provided on the substrate; a thin film transistor provided above the substrate and including a gate electrode and a semiconductor layer; and a first light shielding film and a second light shielding film provided between the semiconductor layer and the substrate. The semiconductor layer includes: a source region formed in a first portion of the semiconductor layer which is positioned on the first side in a first direction with respect to the gate electrode when seen in a plan view; and a drain region formed in a second portion of the semiconductor layer which is positioned on the opposite side to the first side in the first direction with respect to the gate electrode when seen in a plan view. Both the first light shielding film and the second light shielding film overlap the semiconductor layer when seen in a plan view, and are spaced apart from each other in the first direction.

As another aspect, both the first light shielding film and the second light shielding film may overlap the gate electrode when seen in a plan view. The display device may include a third light shielding film provided outside a region where the semiconductor layer is formed when seen in a plan view, and the first light shielding film and the second light shielding film may be connected to each other via the third light shielding film. The gate electrode may or may not overlap the third light shielding film when seen in a plan view. The semiconductor layer may extend in a first direction when seen in a plan view, each of the gate electrode, the first light shielding film, and the second light shielding film may extend in a second direction intersecting the first direction when seen in a plan view, and the third light shielding film may extend in a third direction intersecting the second direction.

As still another aspect, the semiconductor layer may include: a first semiconductor region formed in a third portion of the semiconductor layer which is positioned between the gate electrode and the source region when seen in a plan view; and a second semiconductor region formed in a fourth portion of the semiconductor region which is positioned between the gate electrode and the drain electrode when seen in a plan view. At this time, the source region may be formed by introducing impurities of a first conductivity type into the first portion of the semiconductor layer, and the drain region may be formed by introducing the impurities of the first conductivity type into the second portion of the semiconductor layer. The first semiconductor region may be formed by introducing the impurities of the first conductivity type into the third portion of the semiconductor layer, and the second semiconductor region may be formed by introducing the impurities of the first conductivity type into the fourth portion of the semiconductor layer. The concentration of the impurities of the first conductivity type in the first semiconductor region may be lower than the concentration of the impurities of the first conductivity type in the source region, and the concentration of the impurities of the first conductivity type in the second semiconductor region may be lower than the concentration of the impurities of the first conductivity type in the drain region.

As still another aspect, the first semiconductor region may be formed in the region where the first light shielding film is formed when seen in a plan view, and the second semiconductor region may be formed in the region where the second light shielding film is formed when seen in a plan view. A first central position of the first light shielding film in the first direction is arranged on the opposite side to the second light shielding film side with respect to a second central position of the first semiconductor region in the first direction, and a third central position of the second light shielding film in the first direction may be arranged on the opposite side to the first light shielding film side with respect to a fourth central position of the second semiconductor region in the first direction. Each of the first light shielding film and the second light shielding film may be formed of a metal film or an alloy film, and each of the first light shielding film and the second light shielding film may be in an electrically floating state.

Alternatively, a display device according to another aspect of the present invention includes a transparent substrate including a first region and a second region provided outside the first region, and a plurality of pixels provided in the first region in the transparent substrate. The display device includes a thin film transistor provided in the second region in the transparent substrate, and a first light shielding film provided between the thin film transistor and the transparent substrate. The thin film transistor includes a semiconductor layer formed above the second region in the transparent substrate, and a first gate electrode and a second gate electrode formed above or below the semiconductor layer via a gate insulating film. The first gate electrode and the second gate electrode are spaced apart from each other when seen in a plan view. The semiconductor layer includes: a source region formed in a first portion of the semiconductor layer which is positioned on the opposite side to the second gate electrode across the first gate electrode when seen in a plan view; and a drain region formed in a second portion of the semiconductor layer which is positioned on the opposite side to the first gate electrode across the second gate electrode when seen in a plan view. The first light shielding film overlaps the semiconductor layer and overlaps the first gate electrode or the second gate electrode when seen in a plan view. Any one of a first end of the first gate electrode which is on a source region side, a second end of the first gate electrode which is on the drain region side, a third end of the second gate electrode which is on the source region side, and a fourth end of the second gate electrode which is on the drain region side is not arranged on the first light shielding film.

As still another aspect, the display device may include a second light shielding film provided between the thin film transistor and the second region in the transparent substrate, the first light shielding film may overlap the first gate electrode but not overlap the second gate electrode, and the second light shielding film may overlap the second gate electrode but not overlap the first gate electrode. At this time, the first end of the first gate electrode may be arranged on the first light shielding film, the second end of the first gate electrode may not be arranged on the first light shielding film, the third end of the second gate electrode may not be arranged on the second light shielding film, and the fourth end of the second gate electrode may be arranged on the second light shielding film. Alternatively, a fifth end of the first light shielding film which is on the source region side may be arranged below the first gate electrode, and a sixth end of the first light shielding film which is on the drain region side may be arranged below the second gate electrode.

As still another aspect, the semiconductor layer may include a first semiconductor region formed in a third portion of the semiconductor layer which is positioned between the first gate electrode and the source region when seen in a plan view, and a second semiconductor region formed in a fourth portion of the semiconductor layer which is positioned between the second gate electrode and the drain region when seen in a plan view. At this time, the source region may be formed by introducing impurities of a first conductivity type into the first portion of the semiconductor layer, and the drain region may be formed by introducing impurities of a first conductivity type into the second portion of the semiconductor layer. The first semiconductor region may be formed by introducing the impurities of the first conductivity type into the third portion of the semiconductor layer, and the second semiconductor region may be formed by introducing the impurities of the first conductivity type into the fourth portion of the semiconductor layer. The concentration of the impurities of the first conductivity type in the first semiconductor region may be lower than the concentration of the impurities of the first conductivity type in the source region, and the concentration of the impurities of the first conductivity type in the second semiconductor region may be lower than the concentration of the impurities of the first conductivity type in the drain region.

As still another aspect, the first semiconductor region may be arranged in a region where the first light shielding film is formed when seen in a plan view, and the second semiconductor region may be arranged in a region where the second light shielding film is formed when seen in a plan view. Each of the first light shielding film and the second light shielding film may be formed of a metal film or an alloy film, and each of the first light shielding film and the second light shielding film may be in an electrically floating state.

BRIEF DESCRIPTIONS OF THE DRAWINGS

DESCRIPTIONS OF THE PREFERRED EMBODIMENTS

Figure 1:
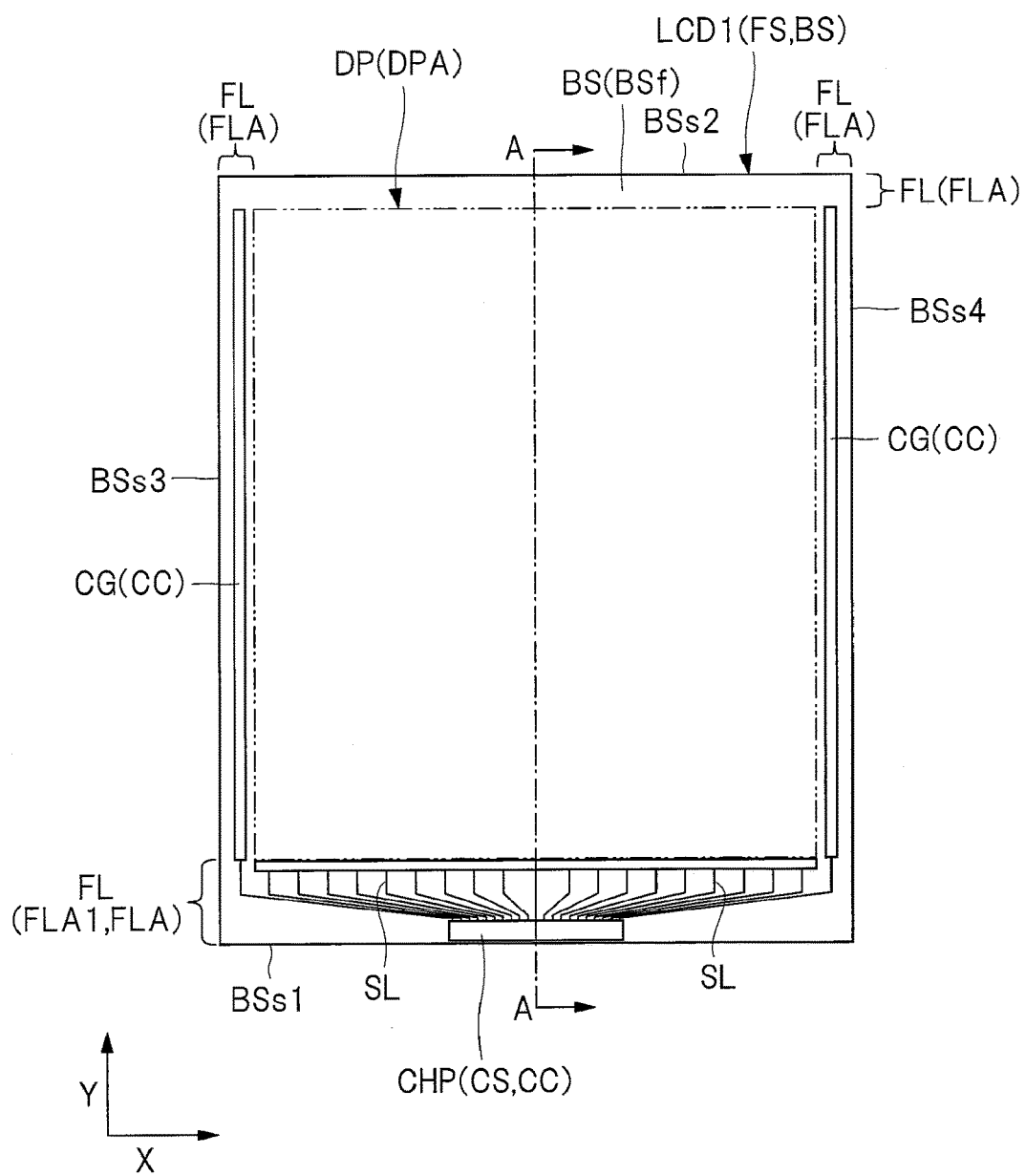
FIG. 1 is a plan view illustrating an example of a display device according to a first embodiment.

The following is explanation for each embodiment of the present invention with reference to drawings.

Note that disclosure is merely one example, and appropriate change with keeping the concept of the present invention which can be easily thought up by those who skilled in the art is obviously contained in the scope of the present invention. Also, in order to make the clear description, the drawings are illustrated more schematically for a width, a thickness, a shape, and others of each portion than those in an actual aspect in some cases. However, they are merely examples, and do not limit the interpretation of the present invention.

In the present specification and each drawing, similar elements to those described earlier for the already-described drawings are denoted by the same reference characters, and detailed description for them is appropriately omitted in some cases.

Further, in some drawings used in the embodiments, hatching is omitted even in a cross-sectional view in some cases so as to make the drawings easy to see. Also, hatching is used even in a plan view in some cases so as to make the drawings easy to see.

The technique explained in the following embodiments is widely applicable to a display device having a mechanism which supplies signals from the periphery of the display region to a plurality of elements provided in the display region with the display functional layer. As the display device as described above, various types of display devices such as a liquid crystal display device or an organic EL (Electro-Luminescence) display device can be exemplified. In the following embodiments, the liquid crystal display device is cited as the representative of the display device for the explanation.

The liquid crystal display device is roughly classified into the following two categories depending on an application direction of an electric field for changing an orientation of liquid crystal molecules of a liquid crystal layer serving as a display functional layer. That is, as the first category, a so-called vertical electric field mode in which an electric field is applied in a thickness direction (or an out-of-plane direction) of the display device is cited. The vertical electric field mode includes, for example, a Twisted Nematic (TN) mode and a Vertical Alignment (VA) mode. As the second category, a so-called transverse electric field mode in which an electric field is applied in a planar direction (or an in-plane direction) of the display device is cited. The transverse electric field mode includes, for example, an In-Plane Switching (IPS) mode and a Fringe Field Switching (FFS) mode serving as one type of the IPS mode. While a technique described below is applicable to both the vertical electric field mode and the transverse electric field mode, the display device with the transverse electric field mode will be cited as an example in an embodiment described below.

First Embodiment

<Configuration of Display Device>

Figure 2:
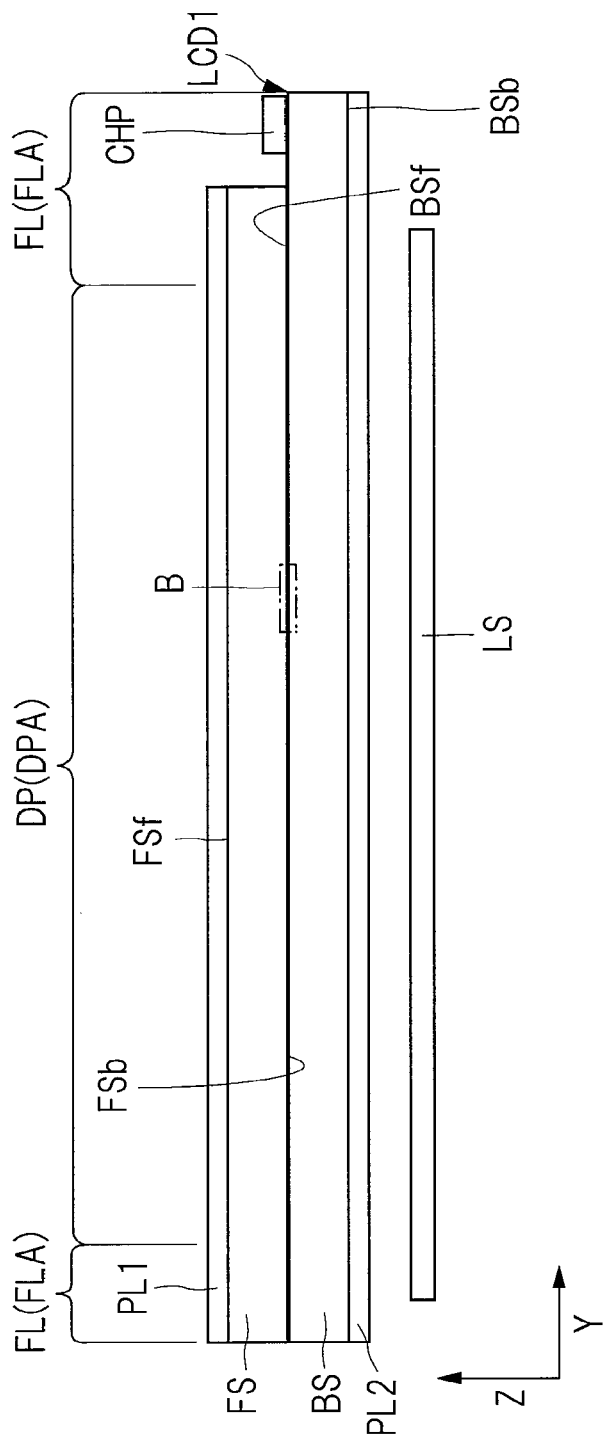
FIG. 2 is a cross-sectional view illustrating an example of a display device according to the first embodiment.
Figure 3:
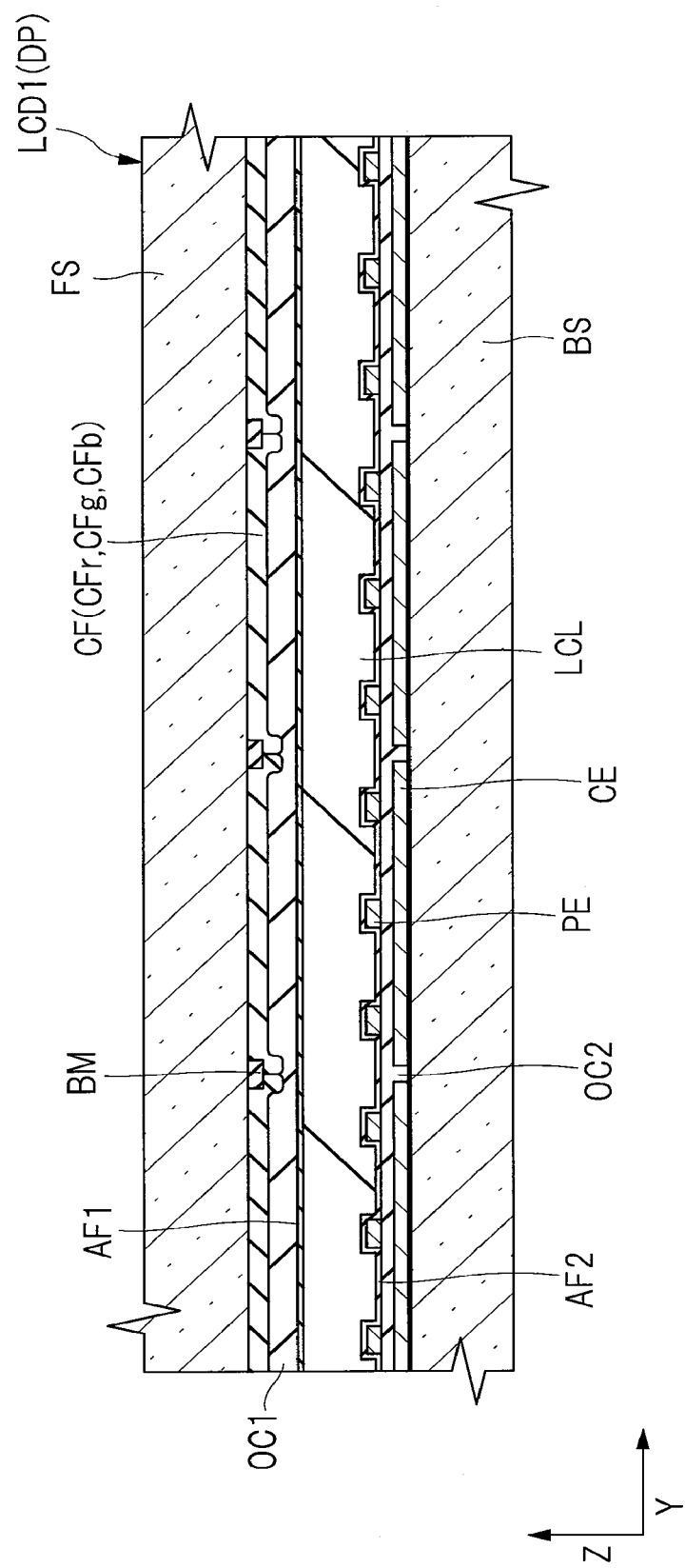
FIG. 3 is a cross-sectional view illustrating an example of a display device according to the first embodiment.

First, a configuration of a display device will be described with reference to FIGS. 1 to 3. FIG. 1 is a plan view illustrating an example of a display device according to a first embodiment. FIGS. 2 and 3 are cross-sectional views illustrating the example of the display device according to the first embodiment. FIG. 2 is a cross-sectional view taken along a line A-A of FIG. 1. FIG. 3 is an enlarged cross-sectional view of a portion B of FIG. 2.

In a display region DPA, note that the illustration of scanning lines GL (see FIG. 4 described below) and video lines SL (see FIG. 4 described below) is omitted for ease of viewing in FIG. 1. While FIG. 2 is a cross-sectional view, hatching is omitted for ease of viewing.

As illustrated in FIG. 1, a display device LCD1 according to the first embodiment includes a display portion DP that displays an image. A region of a substrate BS, where the display portion DP is provided, is the display region DPA. The display device LCD1 includes a frame portion (peripheral portion) FL, where no image is displayed, serving as a portion in periphery of the display portion DP (peripheral portion) when seen in a plan view. A region, where the frame portion FL is provided, is a frame region FLA. That is, the frame region FLA is a region in periphery of the display region DPA (peripheral region).

In the present specification, note that a phrase "when seen in a plan view" means a case of viewing from a direction perpendicular to a front surface (upper surface) BSf (see FIG. 2) serving as a main surface of the substrate BS as illustrated in FIG. 1. Two directions, which intersect, more preferably perpendicular to, each other in the front surface (upper surface) BSf serving as the main surface of the substrate BS, are set to an X-axis direction and a Y-axis direction, and a direction perpendicular to the front surface (upper surface) BSf serving as the main surface of the substrate BS is set to a Z-axis direction.

The display device LCD1 has a structure in which a liquid crystal layer serving as a display functional layer is formed between a pair of substrates oppositely arranged. That is, as illustrated in FIG. 2, the display device LCD1 includes a substrate FS on the display surface side, a substrate BS positioned on the opposite side to the substrate FS, and a liquid crystal layer LCL (see FIG. 3) arranged between the substrate FS and the substrate BS.

As the substrate FS and the substrate BS, various types of substrates which are transparent to visible light, i.e., transparent substrates such as a glass substrate or a film made of resin can be used. In the present specification, note that the phrase "transparent to visible light" means that a transmittance of the visible light is 90% or more, and the phrase "transmittance to visible light" means an average value of the transmittance to light having a wavelength of, for example, 380 to 780 nm. Therefore, the phrase "transparent substrate" means that the transmittance of the transparent substrate to the visible light is, for example, 90% or more.

When seen in a plan view, the substrate BS illustrated in FIG. 1 has a side BSs1 extending in the X-axis direction, a side BSs2 being parallel to the side BSs1 and extending in the X-axis direction, a side BSs3 intersecting, preferably perpendicular to, the X-axis direction and extending in the Y-axis direction, and a side BSs4 being parallel to the side BSs3 and extending in the Y-axis direction. Respective distances from the sides BSs2, BSs3, and BSs4 of the substrate BS illustrated in FIG. 1 to the display portion DP are substantially the same as each other, and are shorter than a distance from the side BSs1 to the display portion DP.

Hereinafter, in the present specification, a phrase "peripheral edge of the substrate BS" means any one of the side BSs1, the side BSs2, the side BSs3, and the BSs4 forming an outer edge of the substrate BS. A simple phrase "peripheral edge" means a peripheral edge of the substrate BS.

The display portion DP includes pixels Pix (see FIG. 4 described below) serving as a plurality of display elements. That is, the plurality of pixels Pix are provided on the display region DPA in the substrate BS. The plurality of pixels Pix are arranged in a matrix form in the X-axis direction and the Y-axis direction. In the present first embodiment, each of the plurality of pixels Pix includes a thin film transistor (TFT) formed in the display region DPA of the substrate BS which is on the front surface BSf side.

The display device LCD1 includes a plurality of scanning lines GL and a plurality of video lines SL, as described below with reference to FIG. 4. As described below with reference to FIG. 4, each of the plurality of scanning lines GL is electrically connected to the plurality of pixels Pix arranged in the X-axis direction, and each of the plurality of video lines SL is electrically connected to the plurality of pixels Pix arranged in the Y-axis direction.

The display device LCD1 includes a driving circuit CC. The driving circuit CC includes a scanning line driving circuit CG and a video line driving circuit CS. The scanning line driving circuit CG is electrically connected to the plurality of pixels Pix (see FIG. 4, described below) via the plurality of scanning lines GL (see FIG. 4, described below), and the video line driving circuit CS is electrically connected to the plurality of pixels Pix (see FIG. 4, described below) via the plurality of video lines SL.

In an example illustrated in FIG. 1, a semiconductor chip CHP is provided in a frame region FLA1 serving as a portion of the frame region FLA, the portion being between a side BSs1 of the substrate BS and the display portion DP. The video line driving circuit CS is provided in the semiconductor chip CHP. Therefore, the video line driving circuit CS is provided in the frame region FLA1 serving as a region of the substrate BS which is on the front surface BSf side, the region being provided the frame region FLA1 which is a region arranged on the negative side of the display region DPA in the Y-axis direction.

Note that the semiconductor chip CHP may be provided in the frame region FLA1 using a so-called Chip On Glass (COG) technique. Alternatively, the semiconductor chip CHP may be provided outside the substrate BS and be connected to the substrate BS via Flexible Printed Circuits (FPCs).

The display device LCD1 includes a sealing portion formed in the frame region FLA when seen in a plan view. The sealing portion is formed to continuously surround the display portion DP, and the substrate FS and the substrate BS illustrated in FIG. 2 are adhesively fixed to each other by a sealing material provided in the sealing portion. As described above, when the sealing portion is provided in periphery of the display portion DP, the liquid crystal layer LCL (see FIG. 3) serving as a display functional layer can be sealed.

As illustrated in FIG. 2, on the back surface (lower surface) BSb side of the substrate BS in the display device LCD1, a backlight LS composed of an optical element such as a light source or a diffusion plate and a polarizing plate PL2 that polarizes light caused from the backlight LS are provided. The polarizing plate PL2 is fixed to the substrate BS. On the other hand, on the front surface (upper surface) FSf side of the substrate FS, a polarizing plate PL1 is provided. The polarizing plate PL1 is fixed to the substrate FS.

While basic components of the display device are exemplified in FIG. 2, other components can be added in addition to the components illustrated in FIG. 2 as a modification example. For example, a protective film or a cover member may be attached to a front surface of the polarizing plate PL1 as a protective layer for protecting the polarizing plate PL1 from scratches or dirt. For example, an aspect in which an optical element such as a phase difference plate is attached to the polarizing plates PL1 and PL2 is applicable. Alternatively, a method of depositing the optical element is applicable to each of the substrates FS and BS.

As illustrated in FIG. 3, the display device LCD1 includes a plurality of pixel electrodes PE and a common electrode CE arranged between the substrate FS and the substrate BS. The display device LCD1 according to the first embodiment is a display device with a transverse electric field mode as described above, and therefore, each of the plurality of pixel electrodes PE and the common electrode CE is formed on the substrate BS.

The substrate BS is formed of a glass substrate or others, and has a circuit for image display mainly formed therein. The substrate BS has the front surface (upper surface) BSf (see FIG. 2) positioned on the substrate FS side and the back surface (lower surface) BSb (see FIG. 2) positioned on the opposite side thereof. On the front surface BSf side of the substrate BS, a driving element such as a TFT and the plurality of pixel electrodes PE are formed in a matrix form. The substrate BS is a transparent substrate including the display region DPA and the frame region FLA provided outside the display region DPA.

In an example illustrated in FIG. 3, the display device LCD1 with the transverse electric field mode (specifically, an FFS mode) is illustrated. Therefore, the common electrode CE is formed on the front surface BSf side of the substrate BS (see FIG. 2), and is covered with an insulating layer OC2. The plurality of pixel electrodes PE are formed on the substrate FS side of the insulating layer OC2 to oppose the common electrode CE via the insulating layer OC2.

The substrate FS illustrated in FIG. 3 is formed of a glass substrate, and has a color filter CF forming an image for color display formed therein. The substrate FS has the front surface (upper surface) FSf (see FIG. 2) on the display surface side and the back surface (lower surface) FSb (see FIG. 2) positioned on the opposite side to the front surface FSf. The substrate BS can be referred to as a TFT substrate, and the substrate FS having the color filter CF formed therein can be referred to as a color filter substrate or an opposite substrate because it opposes the TFT substrate via a liquid crystal layer. As a modification to FIG. 3, note that a configuration in which the color filter CF is provided to the substrate BS serving as the TFT substrate may be used.

In the color filter CF in the substrate FS serving as the opposite substrate, color filter pixels CFr, CFg, and CFb in three colors of R (Red), G (Green), and B (Blue) are periodically arranged. In the color display device, the pixels for displaying, for example, R (red), G (green), and B (blue) are set as sub-pixels, respectively, and the sub-pixels in the three colors are set as one set to form one pixel. The plurality of color filter pixels CFr, CFg, and CGb in the substrate FS are arranged at positions opposing sub-pixels having the pixel electrodes PE formed in the substrate BS, respectively.

A light shielding film BM is formed at a boundary among the color filters CFr, CFg, and CFb in the respective colors. The light shielding film BM is referred to as a black matrix, and is made of, for example, a black resin or a metal having low reflectivity. The light shielding films BM are formed in a lattice form when seen in a plan view. In other words, the substrate FS includes the color filter pixels CFr, CFg, and CFb in the respective colors formed in openings in the light shielding films BM formed in the lattice form. Note that the sub-pixels forming one pixel are not limited to the sub-pixels in the three colors of R (red), G (green), and B (blue), and may include a sub-pixel in white (W) or others having a further transparent filter. The form of the black matrix is not limited to the lattice form, and may be a stripe form.

The light shielding film BM provided in the substrate FS is also formed in the frame region FLA. The light shielding film BM is also formed in the display region DPA. Generally, an end of the opening formed on the peripheral edge side among the openings which are formed in the light shielding film BM and in each of which the color filter CF is embedded is defined as a boundary between the display region DPA and the frame region FLA. Note that a dummy color filter may be provided in the peripheral edge.

The substrate FS includes a resin layer OC1 that covers the color filter CF. The light shielding films BM are formed at the boundaries among the color filter pixels CFr, CFg, and CFb in the respective colors. Therefore, the liquid crystal layer side of the color filter CF has an irregular surface. The resin layer OC1 functions as a flattening film for flattening irregularities on the liquid crystal layer side of the color filter CF. Alternatively, the resin layer OC1 functions as a protective film for preventing diffusion of the impurities from the color filter CF toward the liquid crystal layer. In the resin layer OC1, a component to be cured is contained by providing energy such as a thermosetting resin component or a light curing resin component to a material, so that the resin material can be cured.

A liquid crystal layer LCL is provided between the substrate FS and the substrate BS, the liquid crystal layer LCL forming a display image caused by an electric field formed by applying a display voltage between the pixel electrode PE and the common electrode CE. The liquid crystal layer LCL modulates the light that passes therethrough in accordance with a state of the applied electric field.

The substrate FS has an orientation film AF1 for covering a resin layer OC1 on a back surface (lower surface) FSb serving as an interface contacting the liquid crystal layer LCL. The substrate BS has an orientation film AF2 covering the insulating layer OC2 and the plurality of pixel electrodes PE on the front surface BSf serving as an interface contacting the liquid crystal layer LCL. The orientation films AF1 and AF2 are resin films formed to align an initial orientation of a liquid crystal included in the liquid crystal layer LCL, and are made of, for example, polyimide resin.

In the liquid crystal device LCD1 illustrated in FIG. 3, light emitted from the backlight LS (see FIG. 2) is filtered by the polarizing plate PL2 (see FIG. 2), and the light which passes through the polarizing plate PL2 is incident on the liquid crystal layer LCL. The light incident on the liquid crystal layer LCL is propagated in a thickness direction of the liquid crystal layer LCL (in other words, a direction from the substrate BS toward the substrate FS) while changing a light polarization state in accordance with refractive index antisotropy (in other words, birefringence) of the liquid crystal, and is emitted from the substrate FS.

At this time, the orientation of the liquid crystal is controlled by an electric field formed by applying a voltage to the pixel electrode PE and the common electrode CE, and the liquid crystal layer LCL functions as an optical shutter. That is, in the liquid crystal layer LCL, the transmittance of light can be controlled for each sub-pixel. The light which has reached the substrate FS is subjected to color filtering processing (i.e., processing for absorbing light having a wavelength other than a predetermined wavelength) in the color filter CF formed in the substrate FS, and is emitted from the front surface FSf. The light which has been emitted from the front surface FSf is further filtered by the polarizing plate PL1, and reaches a viewer VW.

Note that the thickness of the liquid crystal layer LCL is extremely smaller than each thickness of the substrate FS and the substrate BS. In the example illustrated in FIG. 3, the thickness of the liquid crystal layer LCL is, for example, about 3 μm to 4 μm.

<Equivalent Circuit of Display Device>

Next, an equivalent circuit of a display device will be described with reference to FIG. 4. FIG. 4 is a diagram illustrating the equivalent circuit of the display device according to the first embodiment.

Figure 4:
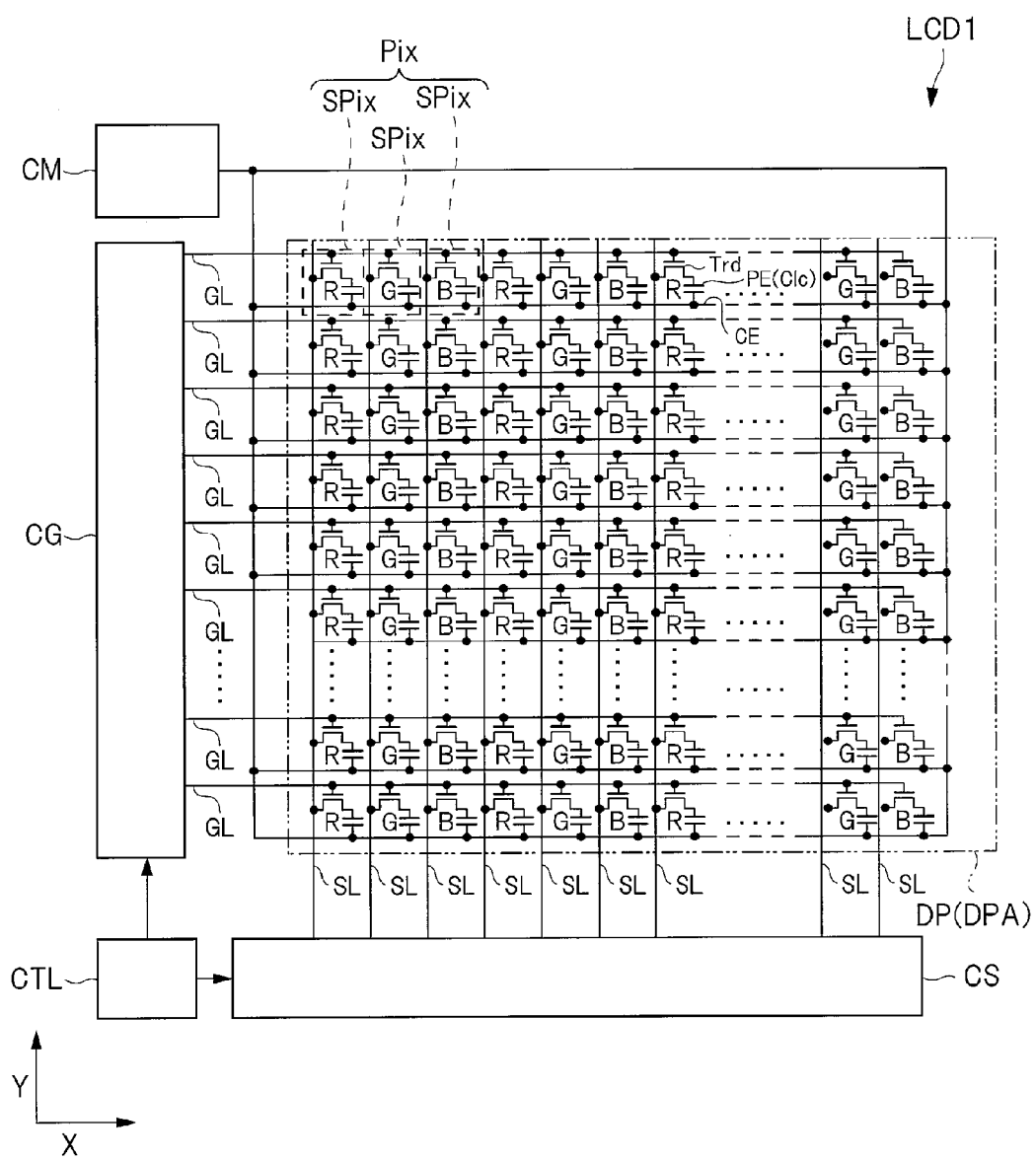
FIG. 4 is a diagram illustrating an equivalent circuit of a display device according to the first embodiment.

As illustrated in FIG. 4, a display portion DP in a display device LCD1 includes a plurality of pixels Pix. The plurality of pixels Pix are arranged in a matrix form in the X-axis direction and the Y-axis direction.

The display device LCD1 includes a plurality of scanning lines GL and a plurality of video lines SL. The plurality of scanning lines GL are provided in the display region DPA, and extend in the X-axis direction. The plurality of video lines SL are provided in the display region DPA, and extend in the Y-axis direction. The plurality of video lines SL and the plurality of scanning lines GL intersect each other.

The plurality of pixels Pix includes sub-pixels SPix displaying the respective colors of R (red), G (green), and B (blue). Each of the sub-pixels SPix is provided in a region surrounded by the adjacent two scanning lines GL and the adjacent two video lines SL. However, other configurations may be applicable, the other configuration providing two sub-pixels in a region surrounded by the adjacent two scanning lines GL and the adjacent two video lines SL.

Each of the sub-pixels SPix includes a transistor Trd formed of a thin film transistor, a pixel electrode PE connected to a drain electrode of the transistor Trd, and a common electrode CE opposing the pixel electrode PE across a liquid crystal layer. Note that FIG. 4 illustrates, as a capacitance Clc, a liquid crystal capacitance equivalently representing a liquid crystal layer and a retentive capacitance formed between the common electrode CE and the pixel electrode PE. Note that a potential having a different polarity from the polarity of the common electrode CE may be supplied to the pixel electrode PE. At this time, a drain electrode and a source electrode of the thin film transistor are appropriately switched to each other depending on the polarity of the potential.

The driving circuit CC (see FIG. 1) in the display device LCD1 includes the video line driving circuit CS, the scanning line driving circuit CG, a control circuit CTL, and a common electrode driving circuit CM. Any one of the video line driving circuit CS, the scanning line driving circuit CG, the control circuit CTL, and the common electrode driving circuit CM includes, for example, a transistor, described below with reference to FIGS. 5 and 6.

The source electrode of each of the transistors Trd in the plurality of sub-pixels SPix arranged in the Y-axis direction is connected to the video line SL. Each of the plurality of video lines SL corresponds to display data, and is connected to the video line driving circuit CS serving as an input portion to which a video signal to be supplied to each of the sub-pixels SPix is input.

A gate electrode of each of the transistors Trd in the plurality sub-pixels SPix arranged in the X-axis direction is connected to the scanning line GL. Each of the scanning lines GL is connected to the scanning line driving circuit CG for supplying a scanning signal to be supplied to each of the sub-pixels SPix.

The control circuit CTL controls the video line driving circuit CS, the scanning line driving circuit CG, and the common electrode driving circuit CM based on display data and display control signals such as a clock signal and a display timing signal that are transmitted from outside the display device.

The control circuit CTL appropriately converts the display data and the display control signals supplied from outside, and outputs the display data and the display control signals to the video line driving circuit CS, the scanning line driving circuit CG, and the common electrode driving circuit CM depending on an arrangement of the sub-pixels of the display device, a display method, the presence or absence of an RGB switch (whose illustration is omitted), the presence or absence of a touch panel (whose illustration is omitted), or others.

<Arrangement of Transistor and Light Shielding Film>

As described above, any one of the video line driving circuit CS, the scanning line driving circuit CG, the control circuit CTL, and the common electrode driving circuit CM includes a transistor. Accordingly, next, an example in which the arrangement of the transistor and the light shielding film in the display device according to the first embodiment is applied to an arrangement of a transistor and a light shielding film provided in a frame region will be described.

Figure 5:
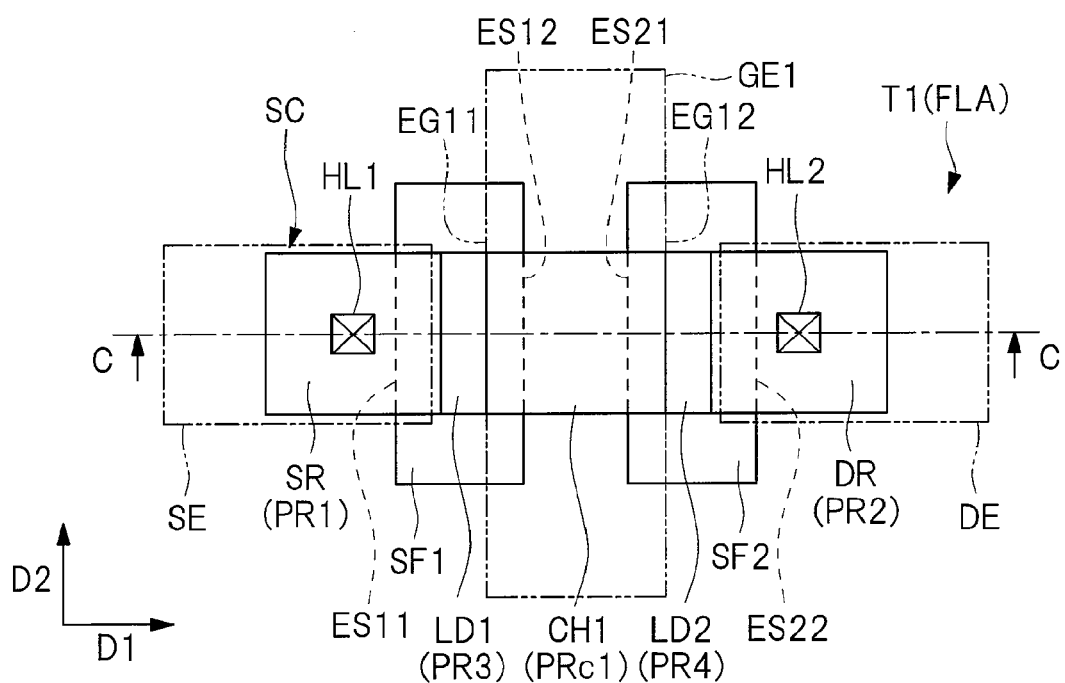
FIG. 5 is a plan view of a transistor and a light shielding film in the first embodiment.
Figure 6:
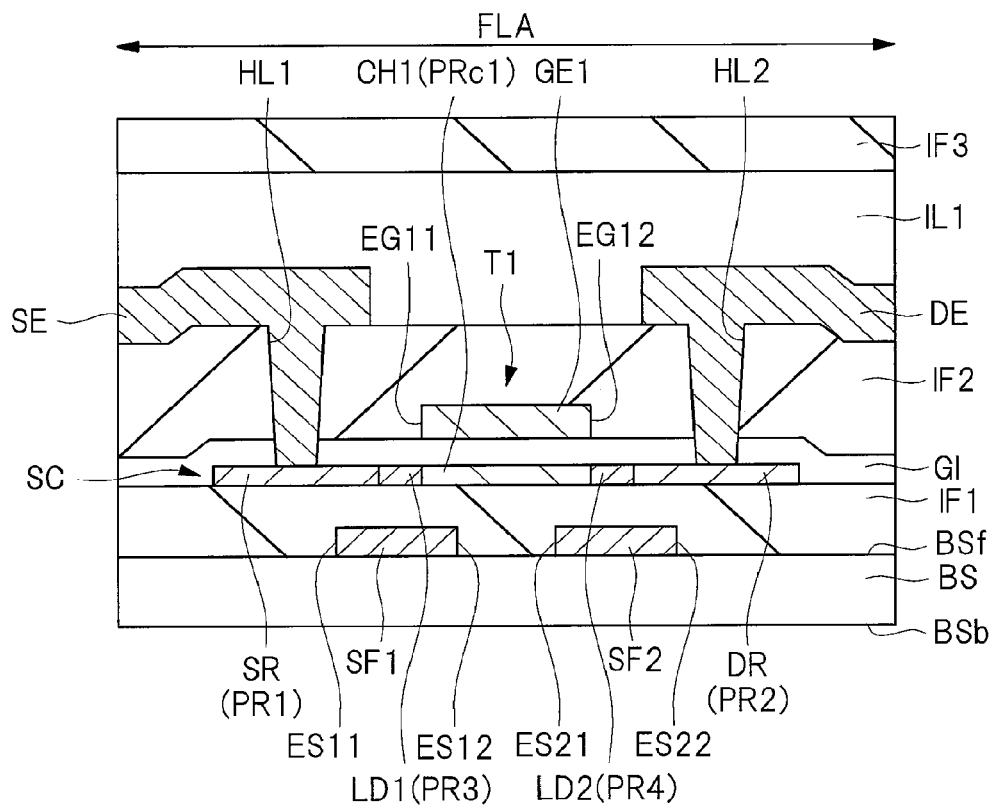
FIG. 6 is a cross-sectional view of the transistor and the light shielding film in the first embodiment.

FIG. 5 is a plan view of the transistor and the light shielding film in the first embodiment. FIG. 6 is a cross-sectional view of the transistor and the light shielding film in the first embodiment. FIG. 6 is a cross-sectional view taken along a line C-C illustrated in FIG. 5. FIG. 5 illustrates a transparently-viewed state obtained by removing portions other than a semiconductor layer SC and light shielding films SF1 and SF2, and illustrates a gate electrode GE1, a source electrode SE, and a drain electrode DE by a two-dot and dash line.

As illustrated in FIG. 6, in the present first embodiment, the transistor T1 is provided above the frame region FLA in the substrate BS. The transistor T1 is formed of a thin film transistor, and includes a semiconductor layer SC, a gate insulating film GI, the gate electrode GE1, the source electrode SE, and the drain electrode DE. For example, when the scanning line driving circuit CG includes the transistor T1, note that the transistor T1 is a transistor that drives any one of the plurality of pixels Pix.

As illustrated in FIGS. 5 and 6, in the first embodiment, the light shielding films SF1 and SF2 are provided on the substrate BS. Preferably, each of the light shielding films SF1 and SF2 is made of a metal such as chromium (Cr), molybdenum (Mo), etc. or an alloy of the metals.

On the substrate BS, an insulating film IF1 is provided to cover the light shielding films SF1 and SF2. The insulating film IF1 is an insulating film made of, for example, silicon nitride, silicon oxide, or a stacked film of these materials. The light shielding films SF1 and SF2 have alight shielding property so that the transistor T1 is not irradiated with the light of a backlight (whose illustration is omitted) incident from the back surface (lower surface) BS side of the substrate BS.

In the present specification, note that the light shielding film having the light blocking effect has desirably the transmittance of visible light of, for example, 10% or less, but not particularly limited to this.

The semiconductor layer SC is formed on the insulating film IF1. While the semiconductor layer SC is made of, for example, amorphous silicon, polycrystalline silicon (poly-silicon), or others, but not limited to silicon.

The gate insulating film GI is formed on the insulating film IF1 to cover the semiconductor layer SC. The gate insulating film GI is an insulating film made of, for example, silicon nitride, silicon oxide, or others. The gate electrode GE1 is provided on the gate insulating film GI. Therefore, the gate electrode GE1 is formed on the semiconductor layer SC via the gate insulating film GI. The gate electrode GE1 is made of metal such as chromium (Cr), molybdenum (Mo), etc. or an alloy of these metals. A type of the transistor is referred to as a top gate type because the gate electrode is provided on the opposite side to the substrate BS across the semiconductor layer.

In the first embodiment, the semiconductor layer SC includes a channel region CH1, the source region SR, and the drain region DR. Here, two directions which intersect each other in the front surface (upper surface) BS of the substrate BS are a direction D1 and a direction D2. At this time, the source region SR is formed in a portion PR1 of the semiconductor layer SC, which is positioned on the negative side in the direction D1 with respect to the gate electrode GE1 when seen in a plan view, and the drain region DR is formed in a portion PR2 of the semiconductor layer SC which is positioned on the positive side in the direction D1 with respect to the gate electrode GE1 when seen in a plan view. The channel region CH1 is formed of a portion PRc1 of the semiconductor layer SC which overlaps the gate electrode GE1 when seen in a plan view. Therefore, the gate insulating film GI is formed on the insulating film IF1 to cover the source region SR, the drain region DR, and the channel region CH1.

The direction D1 illustrated in FIG. 5 may be the same as or different from the X-axis direction or the Y-axis direction illustrated in FIG. 1. Similarly, the direction D2 illustrated in FIG. 5 may be the same as or different from the X-axis direction or the Y-axis direction illustrated in FIG. 1. The positive side in the direction D1 is the same as, for example, a direction of an arrow of the direction D1, and the negative side of the direction D1 is opposite to, for example, a direction of the arrow of the direction D1.

The transistor T1 is, for example, an n-channel thin film transistor. At this time, the source region SR is formed by introducing impurities of an n-conductivity type into the portion PR1 of the semiconductor layer SC, and the drain region DR is formed by introducing impurities of an n-conductivity type into the portion PR2 of the semiconductor layer SC.

In the first embodiment, the semiconductor layer SC preferably includes semiconductor regions LD1 and LD2. The semiconductor region LD1 is formed in a portion PR3 of the semiconductor layer SC which is positioned between the gate electrode GE1 and the source region SR when seen in a plan view, and the semiconductor region LD2 is formed in a portion PR4 of the semiconductor layer SC which is positioned between the gate electrode GE1 and the drain region DR when seen in a plan view.

When the transistor T1 is, for example, an n-channel thin film transistor, the semiconductor region LD1 is formed by introducing impurities of an n-conductivity type into the portion PR3 of the semiconductor layer SC, and the semiconductor region LD2 is formed by intruding impurities of an n-conductivity type into the portion PR4 of the semiconductor layer SC. The concentration of the n-type impurities in the semiconductor region LD1 is lower than the concentration of the n-type impurities in the source region SR, and the concentration of the n-type impurities in the semiconductor region LD2 is lower than the concentration of the n-type impurities in the drain region DR.

Thus, a Lightly Doped Drain (LDD) structure is formed of the semiconductor region LD1 and the source region SR, and an LDD structure is formed of the semiconductor region LD2 and the drain region DR. Therefore, an electric field between the channel region CH1 and the source region SR can be relaxed, and an electric field between the channel region CH1 and the drain region DR can be relaxed. The characteristic of the transistor T1 can be improved by reducing a leak current in, for example, a state in which the transistor T1 is turned off.

Note that the transistor T1 may be a p-channel thin film transistor. At this time, the source region SR is formed by introducing impurities of a p-conductivity type into the portion PR1 of the semiconductor layer SC, and the drain region DR is formed by introducing impurities of a p-conductivity type into the portion PR2 of the semiconductor layer SC. The semiconductor region LD1 is formed by introducing impurities of a p-conductivity type into the portion PR3 of the semiconductor layer SC, and the semiconductor region LD2 is formed by introducing impurities of a p-conductivity type into the portion PR4 of the semiconductor layer SC.

An insulating film IF2 is formed on the gate insulating film GI to cover the gate electrode GE1. The insulating film IF2 is an insulating film made of, for example, silicon nitride, silicon oxide, or others.

A contact hole HL1 which penetrates through the insulating film IF2 and the gate insulating film GI and which reaches the source region SR is formed in the insulating film IF2 and the gate insulating film GI in a portion positioned on the source region SR. A contact hole HL2 which penetrates through the insulating film IF2 and the gate insulating film GI and which reaches the drain region DR is formed in the insulating film IF2 and the gate insulating film GI in a portion positioned on the drain region DR.

The source electrode SE is formed inside the contact hole HL1 and on the insulating film IF2, and the drain electrode DE is formed inside the contact hole HL2 and on the insulating film IF2. The source electrode SE is electrically connected to the source region SR, and the drain electrode DE is electrically connected to the drain region DR. Each of the source electrode SE and the drain electrode DE is made of, for example, a metal having a multi-layer structure in which aluminum (Al) is sandwiched by molybdenum (Mo) or others.

Note that the source region SR and the drain region DR may be replaced with each other, or the source electrode SE and the drain electrode DE may be replaced with each other.

The interlayer resin film IL1 serving as a protective film or a flattening film is formed on the insulating film IF2 to cover the source electrode SE and the drain electrode DE. The interlayer resin film IL1 is made of, for example, acrylic light-sensitive resin. An insulating film IF3 is provided on the interlayer resin film IL1 The insulating film IF3 is an insulating film made of, for example, silicon nitride, silicon oxide, or others.

Consider a case in which the transistor T1 is used as a switching element provided in each of the plurality of pixels Pix (see FIG. 4) provided in the display region DPA (see FIG. 1), as described below with reference to FIG. 17 in a third modification example of the first embodiment. In such a case, the insulating film IF3 is formed between the pixel electrode PE and the common electrode CE, and functions as an inter-electrode insulating film for insulating the pixel electrode PE from the common electrode CE.

In the present first embodiment, both the light shielding films SF1 and SF2 overlap the semiconductor layer SC in a planer view, and are spaced apart from each other in the direction D1. Thus, even when the width of the frame region FLA (see FIG. 1) is reduced as described below with reference to FIGS. 7 to 13, the light shielding films SF1 and SF2 are provided between the transistor T1 and the substrate BS so that the transistor T1 arranged in the frame region FLA can be sufficiently shielded from light. When the two light shielding films SF1 and SF2 are separately provided, a threshold voltage Vth of the transistor T1 arranged in the frame region FLA can be prevented or suppressed from being more shifted toward the negative side than when the light shielding films are provided integrally with each other.

As illustrated in FIG. 5, each of the light shielding films SF1 and SF2 may extend beyond the semiconductor layer SC in the direction D2 when seen in a plan view.

Arrangement of Transistor and Light Shielding Film in First Comparative Example

Next, an arrangement of a transistor and a light shielding film arranged in a frame region in a first comparative example will be described.

Figure 7:
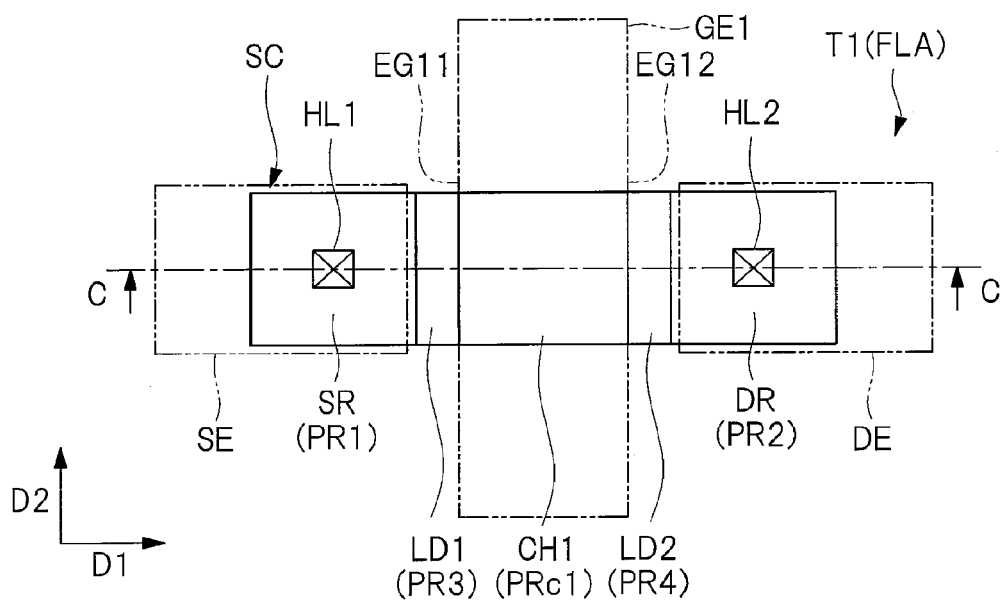
FIG. 7 is a plan view of a transistor in a first comparative example.
Figure 8:
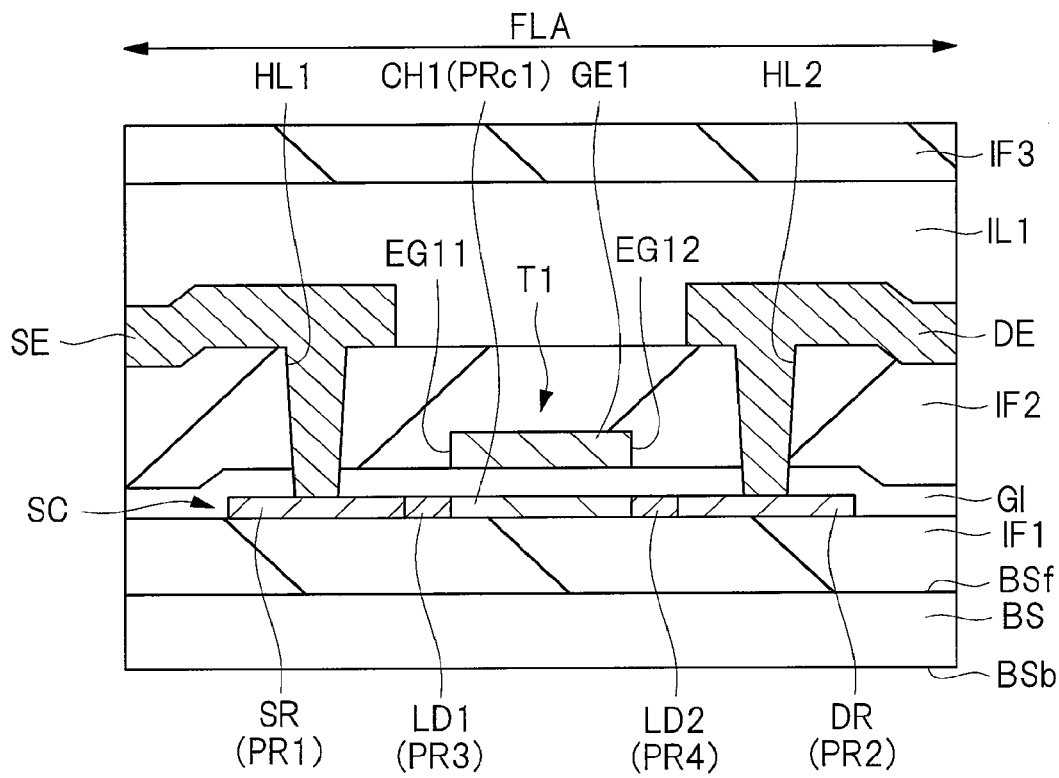
FIG. 8 is a cross-sectional view of the transistor in the first comparative example.

FIG. 7 is a plan view of a transistor in the first comparative example. FIG. 8 is a cross-sectional view of the transistor in the first comparative example. FIG. 8 is a cross-sectional view taken along a line C-C illustrated in FIG. 7. FIG. 7 illustrates a transparently-viewed state obtained by removing a portion other than the semiconductor layer SC, and illustrates a gate electrode GE1, a source electrode SE, and a drain electrode DE by a two-dot and dash line.

As illustrated in FIG. 8, the transistor T1 is also provided above a frame region FLA in a substrate BS also in the first comparative example as similar to the first embodiment. The transistor T1 is formed of a thin film transistor, and includes the semiconductor layer SC, a gate insulating film GI, the gate electrode GE1, the source electrode SE, and the drain electrode DE.

However, in the first comparative example, no light shielding film is provided between the transistor T1 and the substrate BS. Therefore, in the first comparative example, light from a backlight (whose illustration is omitted) incident from the back surface (lower surface) BSb side of the substrate BS is not blocked by a light shielding film.

In both the display device in the first comparative example and the display device in the first embodiment, a light shielding film is provided between the transistor and the substrate BS in a display region DPA in order to prevent a light leak current from flowing by irradiation of light from a backlight incident from the back surface (lower surface) BSb side of the substrate BS onto a transistor provided in each of a plurality of pixels. On the other hand, in the display device in the first comparative example, a light shielding tape is provided between, for example, the backlight and the substrate BS in the frame region FLA in order to prevent the irradiation of the light from the backlight incident from the back surface (lower surface) BSb side of the substrate BS onto each of the plurality of transistors provided in the frame region FLA.

Such a light shielding tape has a light shielding property, and therefore, is desirably arranged outside the display region DPA, i.e., inside the frame region FLA when seen in a plan view. However, when the width of the frame region FLA is reduced, it is difficult to arrange the light shielding tape in the frame region FLA when seen in a plan view. Alternatively, when the light shielding tape is arranged in the frame region FLA when seen in a plan view, it is easy to irradiate the transistor T1 arranged in the frame region FLA with the light from the backlight incident in a direction inclined with respect to a front surface (upper surface) BSf of the substrate BS. In such a case, when the transistor T1 arrange din the frame region FLA is irradiated with the light from the backlight, an error occurs in an operation of the transistor T1, and therefore, there is a risk of decrease in the quality of an image displayed in the display region.

Arrangement of Transistor and Light Shielding Film in Second Comparative Example Next, an arrangement of a transistor and a light shielding film arranged in a frame region in a second comparative example will be described.

Figure 9:
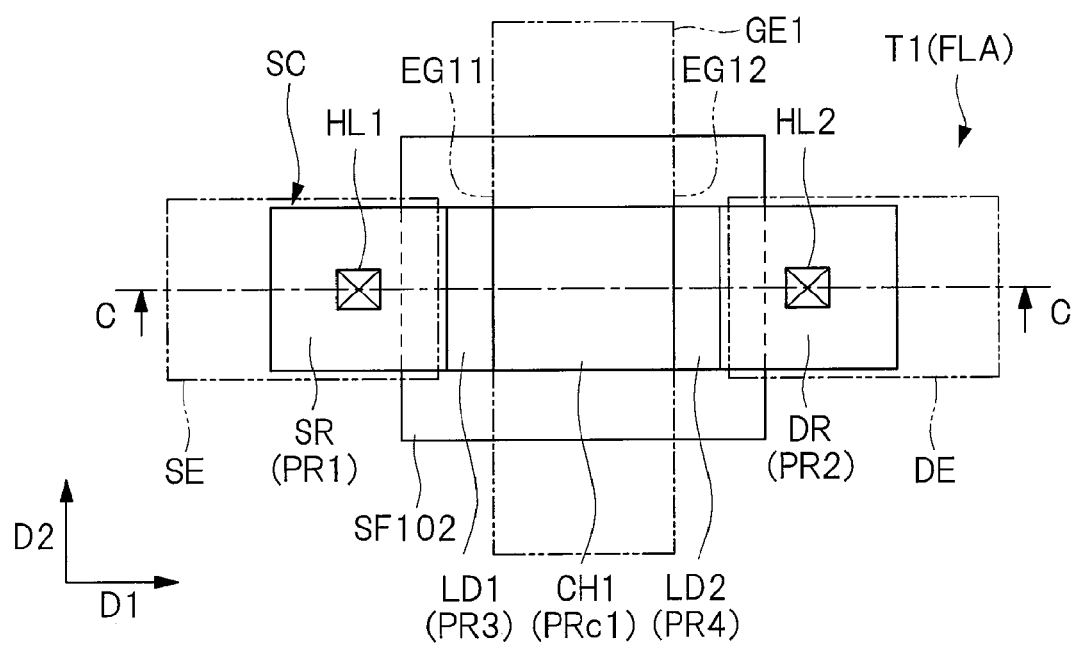
FIG. 9 is a plan view of a transistor and a light shielding film in a second comparative example.
Figure 10:
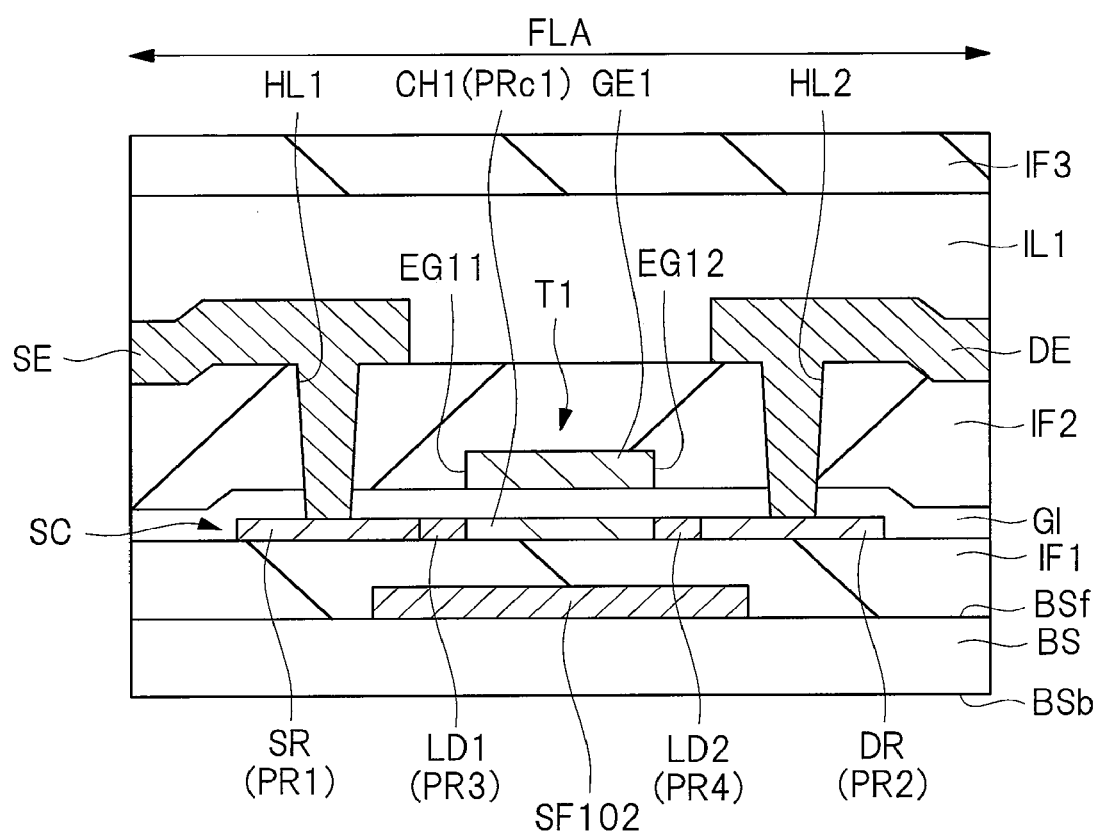
FIG. 10 is a cross-sectional view of the transistor and the light shielding film in the second comparative example.

FIG. 9 is a plan view of a transistor and a light shielding film in the second comparative example. FIG. 10 is a cross-sectional view of the transistor and the light shielding film in the second comparative example. FIG. 10 is a cross-sectional view taken along a line C-C illustrated in FIG. 9. FIG. 9 illustrates a transparently-viewed state obtained by removing a portion other than the semiconductor layer SC and the light shielding film SF 102, and illustrates a gate electrode GE1, a source electrode SE, and a drain electrode DE by a two-dot and dash line.

As illustrated in FIG. 10, the transistor T1 is also provided above a frame region FLA in a substrate BS also in the second comparative example as similar to the first comparative example. The transistor T1 is formed of a thin film transistor, and includes the semiconductor layer SC, a gate insulating film GI, the gate electrode GE1, the source electrode SE, and the drain electrode DE.

And, in the second comparative example, the light shielding film SF102 is provided between the transistor T1 and the substrate BS. Therefore, in the second comparative example, light from a backlight (whose illustration is omitted) incident from the back surface (lower surface) BSb side of the substrate BS is blocked by the light shielding film SF102. In the second comparative example, both the end portion EG11 of the gate electrode GE1 which is on the source region SR side and the end portion EG12 of the gate electrode GE1 which is on the drain region DR side are arranged on the light shielding film SF102.

However, the inventors of the present application have found an issue that a threshold voltage Vth of the transistor T1 is more shifted toward the negative side in the second comparative example than the first comparative example as described below.

Figure 11:
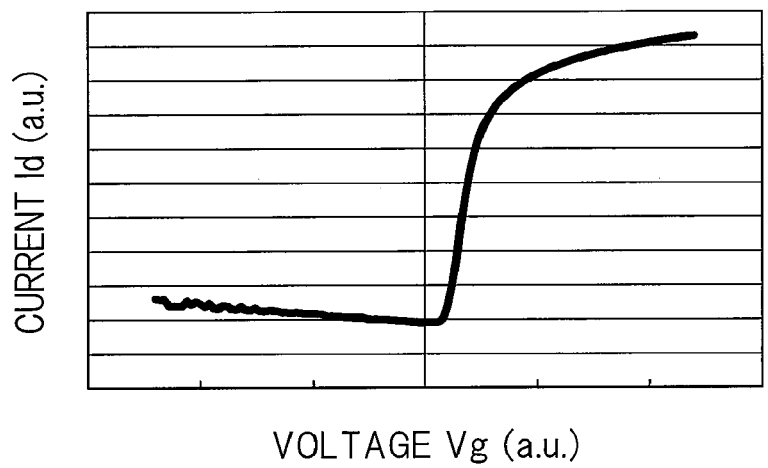
FIG. 11 is a graph illustrating a current/voltage characteristic of the transistor in the first comparative example.
Figure 12:
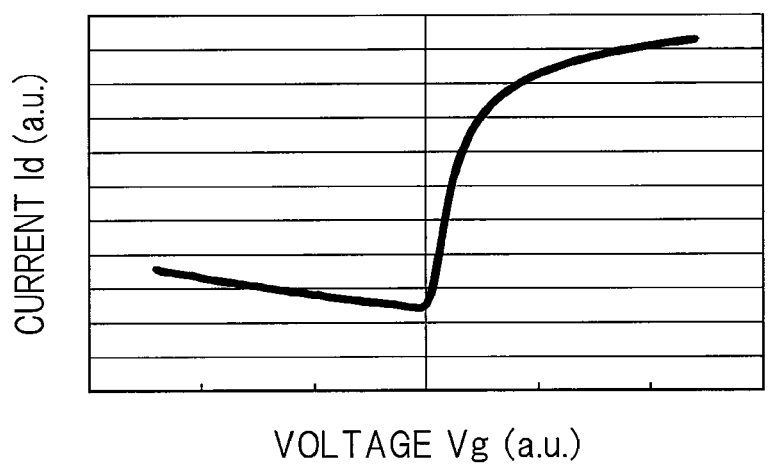
FIG. 12 is a graph illustrating a current/voltage characteristic of the transistor in the second comparative example.
Figure 13:
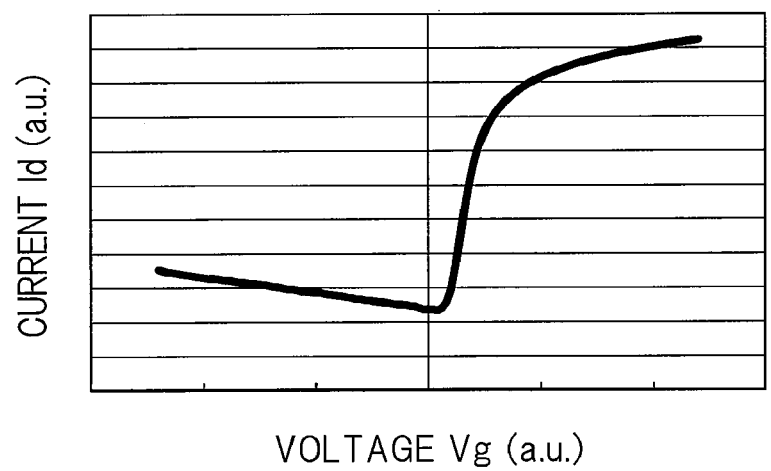
FIG. 13 is a graph illustrating a current/voltage characteristic of the transistor in the first embodiment.

FIG. 11 is a graph illustrating a current/voltage characteristic of the transistor in the first comparative example. FIG. 12 is a graph illustrating a current/voltage characteristic of the transistor in the second comparative example. FIG. 13 is a graph illustrating a current/voltage characteristic of the transistor in the first embodiment. In each of FIG. 11 to FIG. 13, a horizontal axis indicates a voltage Vg serving as a gate voltage, and a vertical axis indicates a current Id serving as a drain current. Note that FIGS. 11 to 13 illustrate results obtained by measuring a current flowing without the irradiation of the light from the backlight, i.e., a dark current. Although illustration of specific numerical values is omitted in the graphs illustrated in FIG. 11 to FIG. 13, the ranges of the horizontal axis and the vertical axis are equal to one another among FIG. 11 to FIG. 13.

When the result illustrated in FIG. 12 is compared with the result illustrated in FIG. 11, the threshold voltage Vth of the transistor T1 is more shifted toward the negative side in the second comparative example in which the light shielding film SF102 is provided than the first comparative example in which no shielding film is provided. Therefore, in the second comparative example, when a voltage Vg serving as a gate voltage is not applied, i.e., when the transistor T1 is retained in an off state, the transistor T1 is turned on so that the quality of an image displayed in a display region DPA is decreased.

On the other hand, when the result illustrated in FIG. 13 is compared with the results illustrated in FIGS. 11 and 12, the threshold voltage Vth of the transistor T1 is hardly more shifted in the first embodiment in which the light shielding films SF1 and SF2 are provided than the first comparative example in which no light shielding film is provided. That is, a shift amount of the threshold voltage Vth of the transistor T1 from that in the first comparative example is more reduced in the first embodiment in which the light shielding films SF1 and SF2 are provided than the second comparative example in which the light shielding film SF102 is provided. Therefore, in the first embodiment, when the voltage Vg serving as a gate voltage is not applied, i.e., when the transistor T1 is retained in an off state, the transistor T1 can be prevented or suppressed from being turned on, and the decrease in the quality of an image displayed in the display region DPA can be prevented or suppressed.

Principal Characteristic and Effect in Present Embodiment

That is, in the present first embodiment, the light shielding films SF1 and SF2 are provided between the transistor T1 and the substrate BS as illustrated in FIGS. 5 and 6. Both the light shielding films SF1 and SF2 overlap the semiconductor layer SC when seen in a plan view, and are spaced apart from each other in the direction D1.

Thus, even when the width of the frame region FLA is reduced, by providing the light shielding films SF1 and SF2 between the transistor T1 and the substrate BS, the transistor T1 arranged in the frame region FLA can be sufficiently shielded from light. When the light shielding films SF1 and SF2 are provided between the transistor T1 and the substrate BS, the threshold voltage Vth of the transistor T1 arranged in the frame region FLA can be prevented or suppressed from being more shifted toward the negative side than when no light shielding film is provided between the transistor T1 and the substrate BS.

In the present first embodiment in which the two light shielding films are separately provided, a reason, why the shift amount of the threshold voltage Vth of the transistor T1 in the first comparative example in which no light shielding film is provided is smaller than that in the second comparative example in which the light shielding film is integrally provided, can be considered as follows. That is, it is considered that an electric field distribution is more changed when the light shielding film is separated into the two light shielding films SF1 and SF2 than when the light shielding film SF102 is integrally provided.

Both the light shielding films SF1 and SF2 preferably overlap the gate electrode GE1 when seen in a plan view. That is, preferably, an end EG11 of the gate electrode GE1 which is on the source region SR side is arranged on the light shielding film SF1, and an end EG112 of the gate electrode GE1 which is on the drain region DR side is arranged on the light shielding film SF2.

Thus, the light shielding film SF1 overlaps the semiconductor layer SC in a portion adjacent to the end EG11 of the gate electrode GE1 when seen in a plan view, and the light shielding film SF2 overlaps the semiconductor layer SC in a portion adjacent to the end EG12 of the gate electrode GE1 when seen in a plan view. Therefore, the light shielding film SF1 tends to overlap the semiconductor region LD1 when seen in a plan view, and the light shielding film SF2 tends to overlap the semiconductor region LD2 when seen in a plan view. Therefore, change of a transistor characteristic due to the incidence of the light from the backlight into the semiconductor regions LD1 and LD2 can be prevented or suppressed.

Furthermore, preferably, the semiconductor region LD1 is formed in a region where the light shielding film SF1 is formed when seen in a plan view, and the semiconductor region LD2 is formed in a region where the light shielding film SF2 is formed when seen in a plan view. In such a case, the change of the transistor characteristic due to the incidence of the light from the backlight into the semiconductor regions LD1 and LD2 can be further reliably prevented or suppressed.

Alternatively, preferably, each of the light shielding films SF1 and SF2 is not electrically connected to, for example, other wirings, and is in an electrically floating state. Consider a case in which a fixed potential is applied to each of the light shielding films SF1 and SF2 by electrically connecting each of the light shielding films SF1 and SF2 to, for example, an external circuit via the other wiring. In such a case, it is required to perform a process for forming the wiring for electrically connecting each of the light shielding films SF1 and SF2 to, for example, the external circuit. Therefore, there is a risk of increase in the number of processes for manufacturing the display device, and the display device cannot be easily manufactured.

Therefore, when each of the light shielding films SF1 and SF2 is not electrically connected to the other wirings, the number of processes for manufacturing the display device can be reduced. Even when each of the plurality of pixels provided in the display device is finely formed so that the number of the pixels provided in the display device is large, each of the light shielding films SF1 and SF2 is not electrically connected to the other wirings, and therefore, the display device can be easily manufactured.

Figure 14:
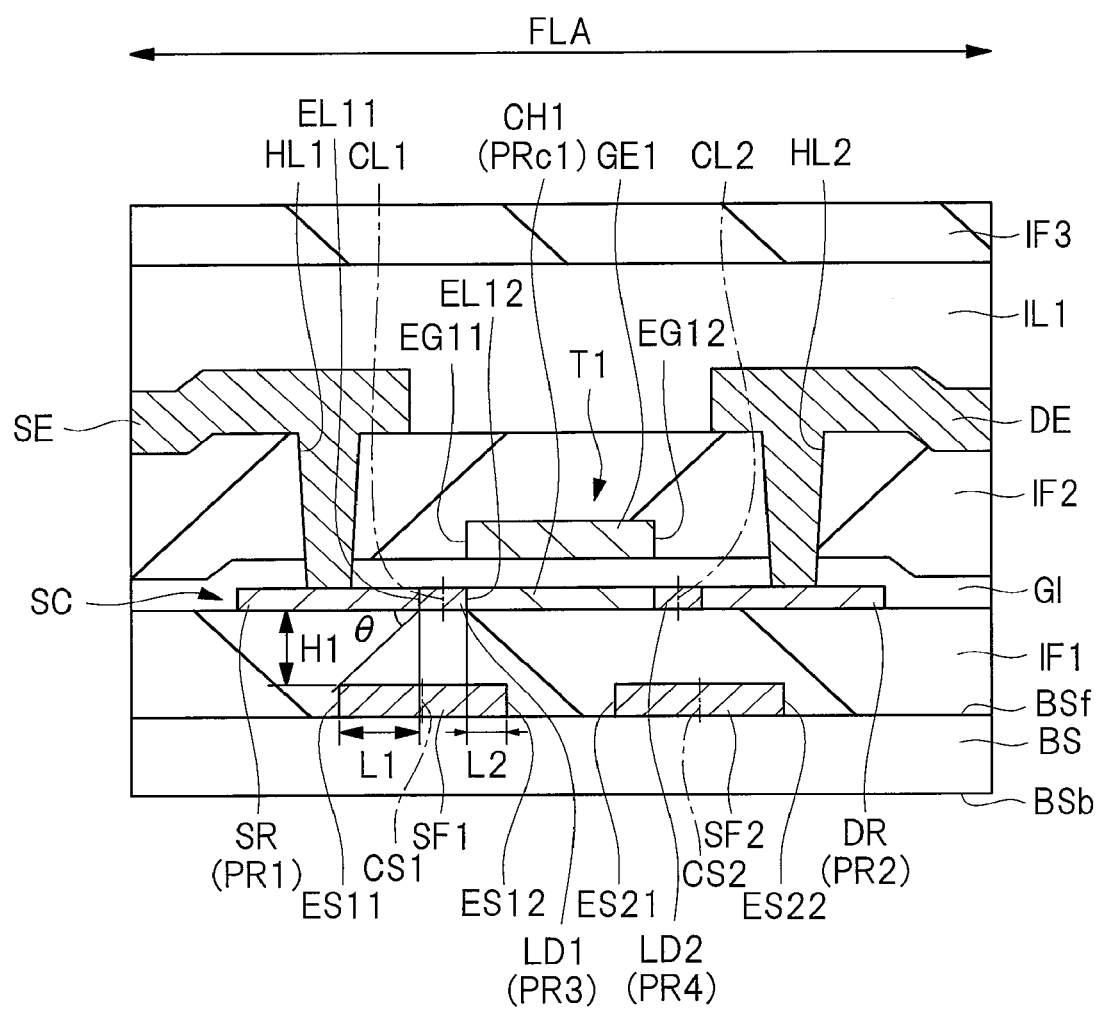
FIG. 14 is a cross-sectional view of the transistor and the light shielding film in the first embodiment.

FIG. 14 is a cross-sectional view of the transistor and the light shielding film in the first embodiment. While FIG. 14 is a cross-sectional view taken along a line C-C illustrated in FIG. 5, as similar to FIG. 6, FIG. 14 illustrates a cross-sectional shape of the light shielding film SF1 preferable to shield the semiconductor region LD1 from light when the backlight is incident in a direction inclined by an angle θ from a direction parallel to the front surface (upper surface) BSf of the substrate BS.

As illustrated in FIG. 14, an end ES11 the light shielding film SF1 which is on the opposite side to the light shielding film SF2 is arranged on the source region SR side with respect to an end EL11 of the semiconductor region LD1 which is on the source region SR side. A distance in a direction parallel to the front surface (upper surface) BSf of the substrate BS between the end ES11 and the end EL11 is set as a distance L1. A distance between the semiconductor layer SC and the light shielding film SF1 in a direction perpendicular to the front surface (upper surface) BSf of the substrate BS is set as a distance H1. Consider a case in which light from a backlight (whose illustration is omitted) is incident in a direction inclined by only an angle θ from a direction parallel to the front surface (upper surface) BSf of the substrate BS.

In such a case, the distance L1 preferably satisfies the following equation (1).

$$L1 \geq H1/\tan\theta \quad (1)$$

When the angle θ is, for example, 45°, the maximum value of the distance L1 becomes equal to the distance H1 from the above-described equation (1). On the other hand, it is required to consider a margin α for a dimensional accuracy in the direction parallel to the front surface (upper surface) BSf of the substrate BS and a dimensional accuracy in the direction perpendicular to the front surface (upper surface) BSf of the substrate BS, i.e., the accuracy of the thickness of the insulating film IF1. The distance L1' obtained when the margin α is considered and the angle θ is 45° preferably satisfies the following equation (2).

$$L1' \geq H1 + \alpha \quad (2)$$

For example, when the width dimension of the semiconductor region LD1 (the length thereof in the direction D1) is about 1 μm, and besides, when the dimensional accuracy of the width dimension of the gate electrode GE1 is about +1 μm, the margin α can be set to 0.5 to 2 μm. Note that the width dimension of the semiconductor region LD1 is formed in a range of 0.25 to 3.0 μm often.

Preferably, a central position CS1 of the light shielding film SF1 in the direction D1 (see FIG. 5) is arranged on the opposite side to the light shielding film SF2 side with respect to a central position CL1 of the semiconductor region LD1 in the direction D1. A central position CS2 of the light shielding film SF2 in the direction D1 is arranged on the opposite side to the light shielding film SF1 side with respect to a central position CL2 of the semiconductor region LD2 in the direction D1.

When light from the backlight is incident in a direction inclined by only the angle θ from the direction parallel to the front surface (upper surface) BSf of the substrate BS, the distance L1 is preferably increased. However, since the light shielding film SF1 and the light shielding film SF2 are spaced apart from each other, a distance L2 between an end ES12 of the light shielding film SF1 which is on the light shielding film SF2 side and an end EL12 of the semiconductor region LD1 which is on the drain region DR side cannot be increased so much. A relation in an arrangement between the light shielding film SF2 and the semiconductor region LD2 is similar to a relation in an arrangement between the light shielding film SF1 and the semiconductor region LD1 except that the light shielding film SF2 and the semiconductor region LD2 are symmetrically arranged to each other across the center of the gate electrode GE1. Therefore, as described above, the central position CS1 is preferably arranged on the source region SR side with respect to the central position CL1, and the central position CS2 is preferably arranged on the drain region DR side with respect to the central position CL2.

First Modification Example of Arrangement of Transistor and Light Shielding Film Next, a first modification example of an arrangement of a transistor and a light shielding film in a frame region will be described.

Figure 15:
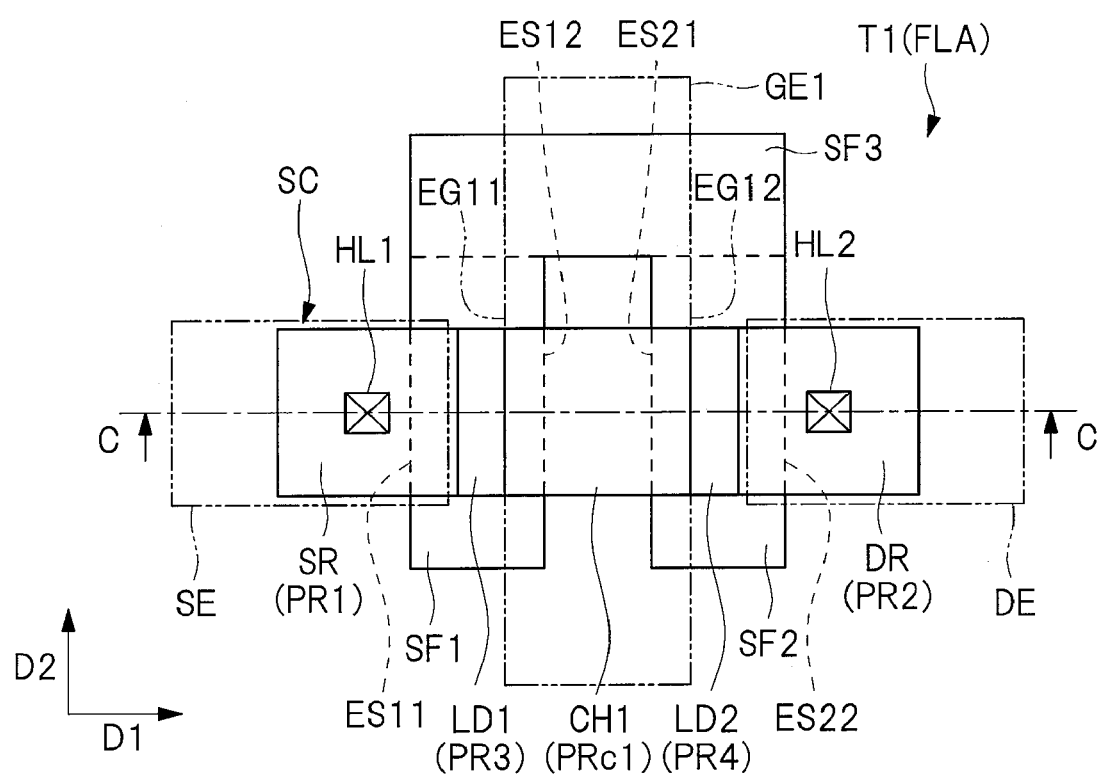
FIG. 15 is a plan view of a transistor and a light shielding film in a first modification example of the first embodiment.

FIG. 15 is a plan view of the transistor and the light shielding film in the first modification example of the first embodiment. FIG. 15 illustrates a transparently-viewed state in which the portions except for the semiconductor layer SC and the light shielding films SF1 and SF2 are removed as similar to FIG. 5, and illustrates a gate electrode GE1, a source electrode SE, and a drain electrode DE by a two-dot and dash line. Note that a cross section taken along a line C-C illustrated in FIG. 15 is similar to the cross section illustrated in FIG. 6.

As illustrated in FIG. 15, in the first modification example, a light shielding film SF3 is provided outside a region where the semiconductor layer SC is formed when seen in a plan view, and the light shielding films SF1 and SF2 are connected to each other via the light shielding film SF3. As similar to the light shielding films SF1 and SF2, the light shielding film 3 is made of, for example, a metal such as chromium (Cr), molybdenum (Mo), etc. or an alloy of these metals. That is, the light shielding film SF3 is formed of a metal film or an alloy film.

Although illustration is omitted, the light shielding film SF3 may be provided on the substrate BS as similar to the light shielding films SF1 and SF2, and an insulating film IF1 may be provided on the substrate BS to cover the light shielding film SF3 in addition to the light shielding films SF1 and SF2.

Also in the present first modification example, the two light shielding films SF1 and SF2 are separately provided between the transistor T1 and the substrate BS as similar to the first embodiment, so that a substantially similar result to the result described with reference to FIG. 13 is obtained. Therefore, also in the present first modification example, a threshold voltage Vth of the transistor T1 arranged in a frame region FLA can also be prevented or suppressed from being more shifted toward the negative side than in the case in which the light shielding film is integrally provided between the transistor T1 and the substrate BS as similar to the first embodiment.

The gate electrode GE1 may be formed not only inside but also outside a region where the semiconductor layer SC is formed. In the present first modification example, the gate electrode GE1 in a portion formed outside the region where the semiconductor layer SC is formed overlaps the light shielding film SF3 when seen in a plan view as different from a second modification example of the first embodiment described below with reference to FIG. 16.

The first modification example is an example in which the gate electrode GE1 and the light shielding film SF3 are arranged so that the light shielding film SF3 and the gate electrode GE1 overlap each other when seen in a plan view when, for example, each of both ends of the gate electrode GE1 in the transistor T1 in the direction D2 is formed integrally with a gate electrode GE1 in another transistor T1.

When the light shielding film SF3 is not provided, the area of each of the light shielding films SF1 and SF2 is small. Therefore, there is a risk of peel off of the light shielding films SF1 and SF2 formed on the substrate BS and formed of, for example, a metal film from the substrate BS formed of, for example, a transparent substrate. Therefore, there are risks of reduction in the shape accuracies of the light shielding films SF1 and SF2, which results in reduction in the electric characteristic of the transistor T1.

On the other hand, in the present first modification, the light shielding films SF1, SF2, and SF3 are integrally formed, and the an area of the integrally-formed light shielding films SF1, SF2, and SF3 is larger than each area of the light shielding films SF1 and SF2. Therefore, the light shielding films SF1 and SF2 formed on the substrate BS and formed of, for example, a metal film can be prevented or suppressed from being peeled off from the substrate BS formed of, for example, a transparent substrate. Therefore, the shape accuracies of the light shielding films SF1 and SF2 can be improved, and the electric characteristic of the transistor T1 can be improved.

As illustrated in FIG. 15, the semiconductor layer SC may extend in the direction D1 when seen in a plan view, each of the gate electrode GE1 and the light shielding films SF1 and SF2 may extend in the direction D2 when seen in a plan view, and the light shielding film SF3 may extend in the direction D1 when seen in a plan view. Thus, the semiconductor layer SC, the gate electrode GE1, and the light shielding films SF1, SF2, and SF3 can be efficiently arranged. Note that a direction in which the light shielding film SF3 extends may be not the direction D1 but at least a direction intersecting the direction D2 when seen in a plan view.

The light shielding film SF1 and the light shielding film SF2 may not be completely separated from each other. For example, an opening or a through hole may be formed in a portion of the integrally-formed light shielding films, the portion overlapping both the semiconductor layer SC and the gate electrode GE1. In such a case, a similar effect to that in the present first modification example is also obtained.

Second Modification Example of Arrangement of Transistor and Light Shielding Film Next, a second modification example of an arrangement of a transistor and a light shielding film in a frame region will be described.

Figure 16:
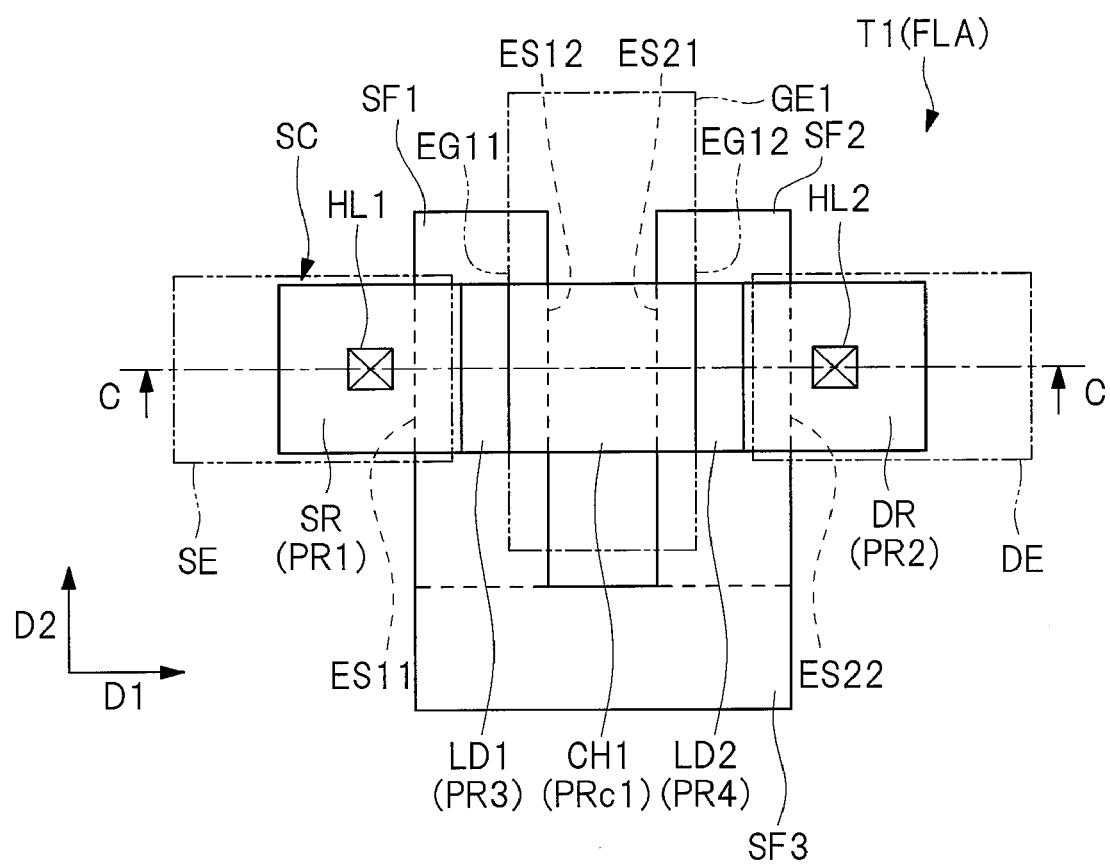
FIG. 16 is a plan view of a transistor and a light shielding film in a second modification example of the first embodiment.

FIG. 16 is a plan view of a transistor and a light shielding film in the second modification example of the first embodiment. FIG. 16 illustrates a transparently-viewed state in which the portions except for the semiconductor layer SC and the light shielding films SF1 and SF2 are removed as similar to FIG. 5, and illustrates a gate electrode GE1, a source electrode SE, and a drain electrode DE by a two-dot and dash line. Note that a cross section taken along a line C-C illustrated in FIG. 16 is similar to the cross section illustrated in FIG. 6.

As illustrated in FIG. 16, in the second modification example, as similar to the first modification example of the first embodiment, a light shielding film SF3 is provided outside a region where the semiconductor layer SC is formed when seen in a plan view, and the light shielding films SF1 and SF2 are connected to each other via the light shielding film SF3. As similar to the light shielding films SF1 and SF2, the light shielding film SF3 is formed of a metal film or an alloy film.

Also in the present second modification example, a threshold voltage Vth of the transistor T1 arranged in a frame region FLA can also be prevented or suppressed from being more shifted toward the negative side than in the case in which the light shielding film is integrally provided between the transistor T1 and the substrate BS as similar to the first embodiment.

The gate electrode GE1 may be formed not only inside but also outside a region where the semiconductor layer SC is formed. In the present second modification example, the gate electrode GE1 in a portion formed outside the region where the semiconductor layer SC is formed does not overlap the light shielding film SF3 when seen in a plan view as different from the first modification example of the first embodiment described above with reference to FIG. 15.

The second modification example is an example in which the gate electrode GE1 and the light shielding film SF3 are arranged so that the light shielding film SF3 and the gate electrode GE1 do not overlap each other when seen in a plan view when, for example, one end of the gate electrode GE1 in the transistor T1 in the direction D2 is not formed integrally with a gate electrode GE1 in another transistor T1.

In the present second modification, as similar to the first modification example of the first embodiment, the light shielding films SF1 and SF2 formed on the substrate BS and formed of, for example, a metal film can be prevented or suppressed from being peeled off from the substrate BS formed of, for example, a transparent substrate.

As illustrated in FIG. 16, the semiconductor layer SC may extend in the direction D1 when seen in a plan view, each of the gate electrode GE1 and the light shielding films SF1 and SF2 may extend in the direction D2 when seen in a plan view, and the light shielding film SF3 may extend in the direction D1 when seen in a plan view. Thus, the semiconductor layer Sc, the gate electrode GE1, and the light shielding films SF1, SF2, and SF3 can be efficiently arranged.

Third Modification Example of Arrangement of Transistor and Light Shielding Film Next, an example in which the arrangement of the transistor and the light shielding film in the first embodiment is applied to an arrangement of the transistor and a light shielding film arranged in a display region will be described as a third modification example of the arrangement of the transistor and the light shielding film.

Figure 17:
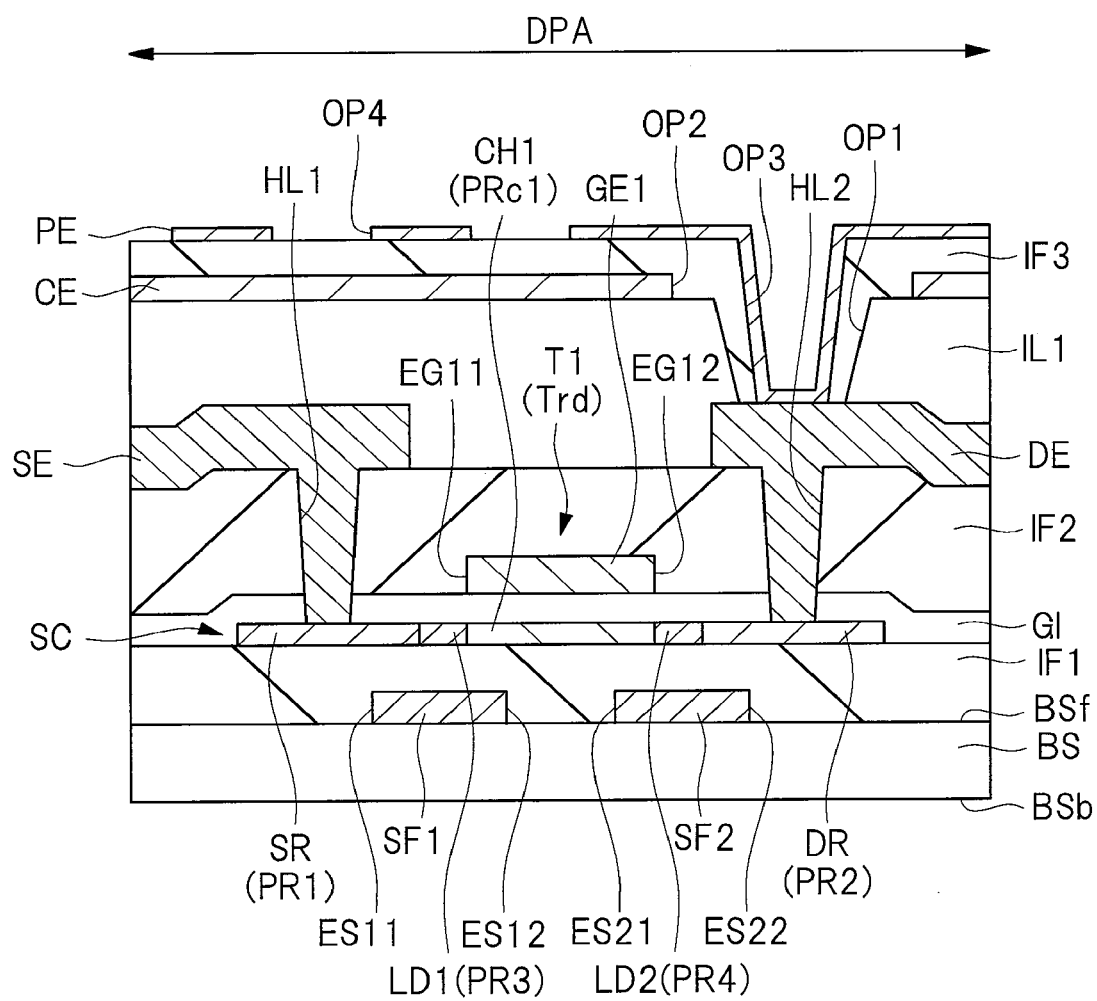
FIG. 17 is a cross-sectional view of a transistor and a light shielding film in a third modification example of the first embodiment.

FIG. 17 is a cross-sectional view of the transistor and the light shielding film in the third modification example of the first embodiment. Note that the arrangement of the transistor and the light shielding film when seen in a plan view in the third modification is similar to the arrangement illustrated in FIG. 5.

As illustrated in FIG. 17, in the present third modification example, a transistor T1 is provided on a display region DPA in a substrate BS as different from the first embodiment. However, portions in a lower layer than source electrode SE, a drain electrode DE, an insulating film IF2, and the insulating film IF2 are similar to those in the arrangement of the transistor and the light shielding film in the first embodiment described above with reference to FIG. 5, and therefore, description for them is omitted. Note that the transistor T1 in the third modification example corresponds to the transistor Trd illustrated in FIG. 4. An interlayer resin film IL1 in the third modification example corresponds to the insulating layer OC2 illustrated in FIG. 3.

As illustrated in FIG. 17, in the present third modification example, an opening OP1, which reaches an upper surface of the drain electrode DE after penetrating the interlayer resin film IL1, is formed in the interlayer insulating film IL1. A common electrode CE is formed on the interlayer resin film IL1. The common electrode CE is made of a transparent conductive material such as ITO (Indium Tin Oxide) or IZO (Indium Zinc Oxide). An opening OP2, which reaches an upper surface of the interlayer insulating film IL1 after penetrating the common electrode CE, is formed in the common electrode CE. The opening OP1 is formed in a region where the opening OP2 is formed.

An insulating film IF3 is formed on an inner wall of the opening OP1, on the drain electrode DE in a portion exposed from the bottom of the opening OP1, and on the interlayer insulating film IL1. On the interlayer insulating film IL1, the insulating film IF3 is formed to cover the common electrode CE.

An opening OP3, which reaches an upper surface of the drain electrode DE in the portion exposed from the bottom of the opening OP1 after penetrating the insulating film IF3, is formed in the insulating film IF3. A pixel electrode PE is formed on the inner wall of the opening OP3, on the drain electrode DE in the portion exposed from the bottom of the opening OP3, and on the insulating film IF3. The pixel electrode PE is electrically connected to the drain electrode DE. The pixel electrode PE is made of a transparent conductive material such as ITO or IZO as similar to the common electrode CE. An opening OP4, which reaches the insulating film IF3 after penetrating the pixel electrode PE, is formed in the pixel electrode PE. Thus, for example, the pixel electrode PE in an FFS mode can be formed.

As described above, in the display region DPA, a light shielding film is provided between the substrate BS and the transistor so that a transistor provided in each of a plurality of pixels is not irradiated with the light from the backlight (whose illustration is omitted) incident from the back surface (lower surface) BSb side of the substrate BS. However, the inventors of the present application have also found a problem in which a threshold voltage Vth of the transistor T1 is more shifted toward the negative side when the light shielding film is provided between the transistor T1 and the substrate BS than when no light shielding film is provided between the transistor T1 and the substrate BS, as similar to the above description with reference to FIGS. 7 to 13, also in the display region DPA.

On the other hand, in the present third modification example, the light shielding films SF1 and SF2 are provided between the transistor T1 and the substrate BS as similar to the first embodiment. Both the light shielding films SF1 and SF2 overlap the semiconductor layer SC when seen in a plan view, and are spaced apart from each other in the direction D1 (see FIG. 5).

Thus, when the light shielding film is provided between the transistor T1 and the substrate BS, a threshold voltage Vth of the transistor T1 arranged in a frame region FLA can be prevented or suppressed from being more shifted toward the negative side than when no light shielding film is provided between the transistor T1 and the substrate BS.

Second Embodiment

In the first embodiment, the example in which one transistor T1 includes only one gate electrode GE has been described. On the other hand, in a second embodiment, an example in which one transistor T1 includes two gate electrodes GE1 and GE2 will be described.

Also in the second embodiment, a configuration of a display device and an equivalent circuit of the display device can be made similar to those in the first embodiment, and therefore, description thereof is omitted. Also in the second embodiment, a plurality of pixels Pix (see FIG. 4) are provided on a display region DPA in a substrate BS as similar to the first embodiment.

Arrangement of Transistor and Light Shielding Film

Next, an example in which the arrangement of the transistor and the light shielding film in the second embodiment is applied to an arrangement of the transistor and a light shielding film arranged in a frame region will be described.

Figure 18:
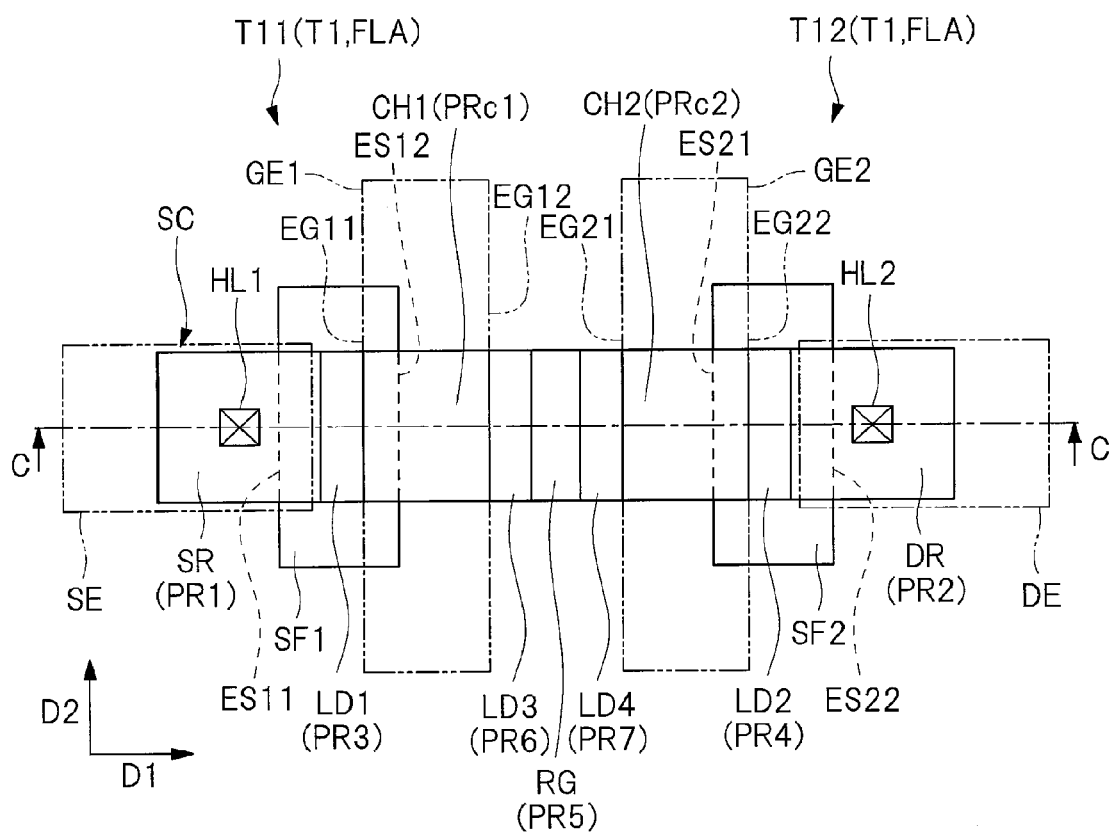
FIG. 18 is a plan view of a transistor and a light shielding film in a second embodiment.
Figure 19:
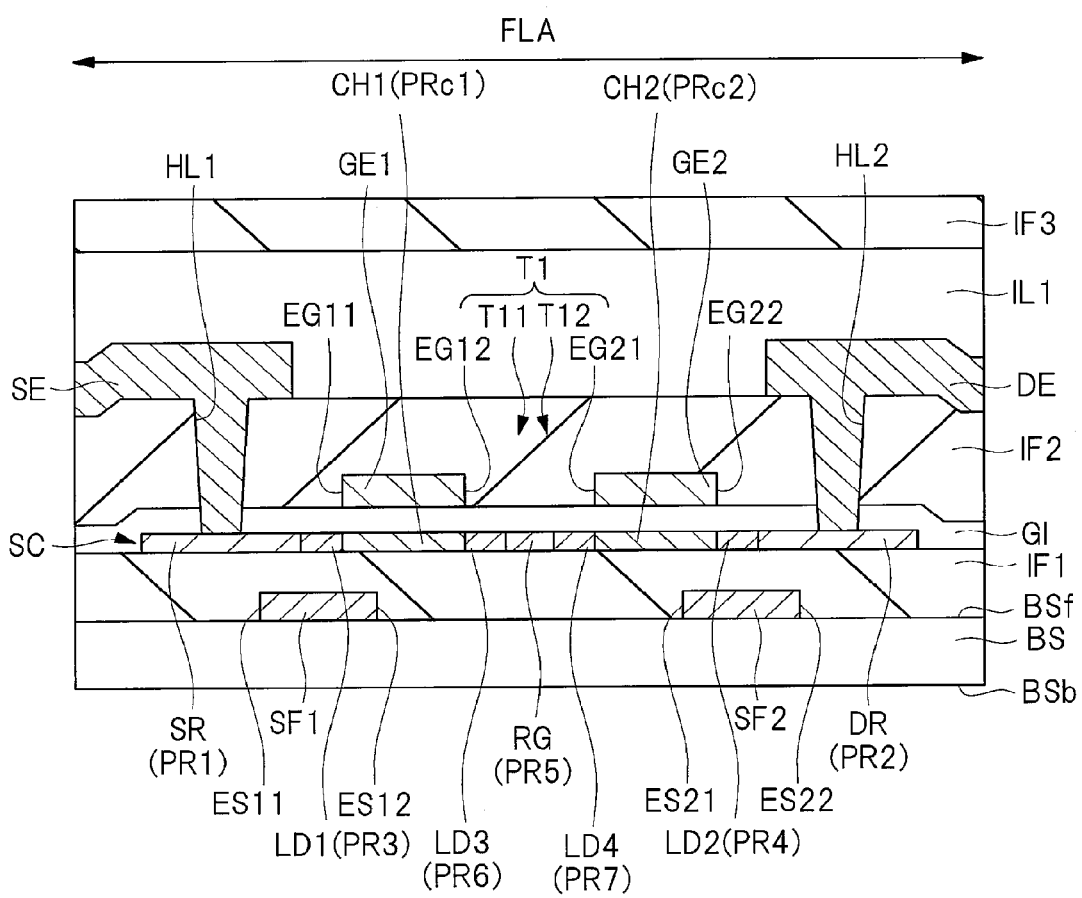
FIG. 19 is a cross-sectional view of the transistor and the light shielding film in the second embodiment.

FIG. 18 is a plan view of the transistor and the light shielding film in the second embodiment. FIG. 19 is a cross-sectional view taken along a line C-C illustrated in FIG. 18. FIG. 18 illustrates a transparently-viewed state in which the portions except for the semiconductor layer SC and the light shielding films SF1 and SF2 are removed as similar to FIG. 5, and illustrates the gate electrodes GE1 and GE2, a source electrode SE, and a drain electrode DE by a two-dot and dash line.

As illustrated in FIG. 19, in the present second embodiment, the transistor T1 is provided above a frame region FLA in the substrate BS as similar to the first embodiment. The transistor T1 is formed of a thin film transistor, and includes a semiconductor layer SC, a gate insulating film GI, the gate electrode GE1, the source electrode SE, and the drain electrode DE. On the other hand, in the second embodiment, the transistor T1 includes the gate electrode GE2 as different from the first embodiment.

As illustrated in FIGS. 18 and 19, in the present second embodiment, the light shielding films SF1 and SF2 are provided on the substrate BS as similar to the first embodiment. Preferably, each of the light shielding films SF1 and SF2 is formed of a metal film or an alloy film. An insulating film IF1 is provided on the substrate BS to cover the light shielding films SF1 and SF2, the semiconductor layer SC is formed on the insulating film IF1, and the gate insulating film GI is formed on the insulating film IF1 to cover the semiconductor layer SC. Therefore, the light shielding films SF1 and SF2 are provided between the transistor T1 and the frame region FLA of the substrate BS, the semiconductor layer SC is formed above the frame region FLA in the substrate BS, and the gate electrodes GE1 and GE2 are formed above the semiconductor layer SC via the gate insulating film GI. Note that only one of the light shielding films SF1 and SF2 may be provided.

The gate electrodes GE1 and GE2 are spaced apart from each other when seen in a plan view between a source region SR and a drain region DR. Therefore, in the present second embodiment, the transistor T1 includes a transistor T11 serving as the transistor T1 formed of a thin film transistor and a transistor T12 serving as the transistor T1 formed of a thin film transistor, which are connected to each other in series, as different from the first embodiment. Note that the gate electrodes GE1 and GE2 may be formed below the semiconductor layer SC via the gate insulating film GI.

In the present second embodiment, the semiconductor layer SC includes a channel region CH1, the source region SR, and the drain region DR as similar to the first embodiment. On the other hand, in the present second embodiment, the semiconductor layer SC includes a channel region CH2, as different from the first embodiment. The source region SR is formed in a portion PR1 of the semiconductor layer SC which is positioned on the negative side in a direction D1 with respect to the gate electrode GE1 when seen in a plan view, and the drain region DR is formed in a portion PR2 of the semiconductor layer SC which is positioned on the positive side in a direction D1 with respect to the gate electrode GE2 when seen in a plan view. In other words, the source region SR is formed in the portion PR1 of the semiconductor layer SC which is positioned on the opposite side to the gate electrode GE2 across the gate electrode GE1 when seen in a plan view, and the drain region DR is formed in the portion PR2 of the semiconductor layer SC which is positioned on the opposite side to the gate electrode GE1 across the gate electrode GE2.

The channel region CH1 is formed of a portion PRc1 of the semiconductor layer SC which overlaps the gate electrode GE1 when seen in a plan view, and the channel region CH2 is formed of a portion PRc2 of the semiconductor layer SC which overlaps the gate electrode GE2 when seen in a plan view. Therefore, the gate insulating film GI is formed to cover the source region SR, the drain region DR, and the channel regions CH1 and CH2 on the insulating film IF1.

The transistor T1 is, for example, an n-channel thin film transistor. At this time, the source region SR is formed by introducing impurities of an n-conductivity type into the portion PR1 of the semiconductor layer SC, and the drain region DR is formed by introducing impurities of an n-conductivity type into the portion PR2 of the semiconductor layer SC.

In the present second embodiment, note that a semiconductor region RG is also formed in a portion PR5 of the semiconductor layer SC which is positioned between the gate electrode GE1 and the gate electrode GE2 when seen in a plan view by introducing impurities of an n-conductivity type thereto.

Also in the present second embodiment, the semiconductor layer SC preferably includes semiconductor regions LD1 and LD2 as similar to the first embodiment. The semiconductor region LD1 is formed in a portion PR3 of the semiconductor layer SC which is positioned between the gate electrode GE1 and the source region SR when seen in a plan view, and the semiconductor region LD2 is formed in a portion PR4 of the semiconductor layer SC which is positioned between the gate electrode GE2 and the drain region DR when seen in a plan view.

When the transistor T1 is, for example, an n-channel thin film transistor, the semiconductor region LD1 is formed by introducing impurities of an n-conductivity type into the portion PR3 of the semiconductor layer SC, and the semiconductor region LD2 is formed by introducing impurities of an n-conductivity type into the portion PR4 of the semiconductor layer SC. The concentration of n-type impurities in the semiconductor region LD1 is lower than the concentration of n-type impurities in the source region SR, and the concentration of n-type impurities in the semiconductor region LD2 is lower than the concentration of n-type impurities in the drain region DR. Thus, an LDD structure is formed by the semiconductor region LD1 and the source region SR, and an LDD structure is formed by the semiconductor LD2 and the drain region DR.

In the present second embodiment, note that a semiconductor region LD3 is also formed in a portion PR6 of the semiconductor layer SC which is positioned between the gate electrode GE1 and the semiconductor region RG when seen in a plan view by introducing impurities of an n-conductivity type thereto. Also, a semiconductor region LD4 is also formed in a portion PR7 of the semiconductor layer SC which is positioned between the gate electrode GE2 and the semiconductor region RG when seen in a plan view by introducing impurities of an n-conductivity type thereto. The concentration of n-type impurities in the semiconductor region LD3 is lower than the concentration of n-type impurities in the semiconductor region RG, and the concentration of n-type impurities in the semiconductor region LD4 is lower than the concentration of n-type impurities in the semiconductor region RG. Thus, an LDD structure is formed by the semiconductor region LD3 and the semiconductor region RG, and an LDD structure is formed by the semiconductor D4 and the semiconductor region RG.

Note that the transistor T1 may be a p-channel thin film transistor.

On the gate insulating film GI, the insulating film IF2 is provided to cover the gate electrodes GE1 and GE2. A portion in a higher layer than the insulating film IF2 is similar to that in the arrangement of the transistor and the light shielding film in the first embodiment described above with reference to FIGS. 5 and 6, and therefore, description thereof is omitted.

In the present second embodiment, the light shielding film SF1 overlaps the semiconductor layer SC, and overlaps the gate electrode GE1 or the gate electrode GE2 when seen in a plan view. Any one of an end EG11 of the gate electrode GE1 which is on the source region SR side, an end EG12 of the gate electrode GE1 which is on the drain region DR side, an end EG21 of the gate electrode GE2 which is on the source region SR side, and an end EG22 of the gate electrode GE2 which is on the drain region DR side is not arranged on the light shielding film SF1.

On the other hand, in the present second embodiment, the light shielding film SF2 overlaps the semiconductor layer SC, and overlaps the gate electrode GE1 or the gate electrode GE2 when seen in a plan view. Any one of the end EG11 of the gate electrode GE1 which is on the source region SR side, the end EG12 of the gate electrode GE1 which is on the drain region DR side, the end EG21 of the gate electrode GE2 which is on the source region SR side, and the end EG22 of the gate electrode GE2 which is on the drain region DR side is not arranged on the light shielding film SF2.

Arrangement of Transistor and Light Shielding Film in Third Comparative Example

Next, an arrangement of a transistor and a light shielding film in a frame region in a third comparative example will be described.

Figure 20:
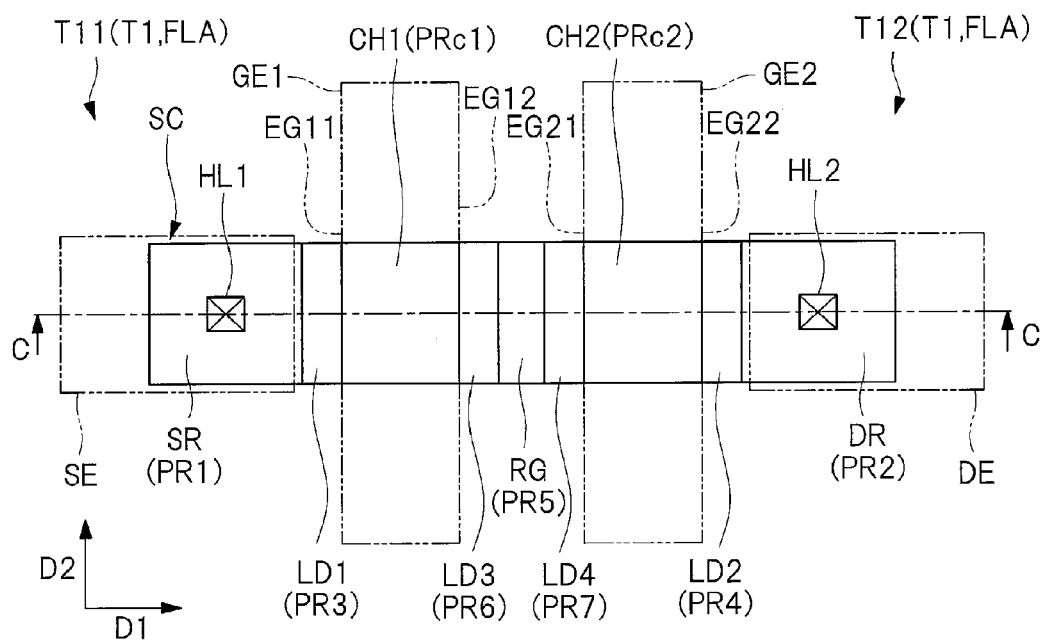
FIG. 20 is a plan view of a transistor in a third comparative example.

FIG. 20 is a plan view of a transistor in the third comparative example. FIG. 20 illustrates a transparently-viewed state in which the portions except for the semiconductor layer SC are removed, and illustrates gate electrodes GE1 and GE2, a source electrode SE, and a drain electrode DE by a two-dot and dash line.

As illustrated in FIG. 20, the transistor T1 is also provided above a frame region FLA in a substrate BS also in the third comparative example as similar to the second embodiment. The transistor T1 is formed of a thin film transistor, and includes the semiconductor layer Sc, a gate insulating film GI (see FIG. 19), the gate electrodes GE1 and GE2, the source electrode SE, and the drain electrode DE.

However, in the third comparative example, no light shielding film is provided between the transistor T1 and the substrate BS. Therefore, in the third comparative example, light from a backlight (whose illustration is omitted) incident from the back surface (lower surface) BSb side of the substrate BS is not blocked by a light shielding film.

In the display device in the third comparative example, a light shielding tape is provided between, for example, the backlight and the substrate BS so that each of a plurality of transistors provided in the frame region FLA is not irradiated with the light from the backlight incident from the back surface (lower surface) BSb side of the substrate BS illustrated in FIG. 19. However, also in the third comparative example, it is difficult to arrange the light shielding tape in the frame region FLA when seen in a plan view as similar to the first comparative example. Also in the third comparative example, it tends to be easy to irradiate the transistor T1 arranged in the frame region FLA with the light from the backlight incident in a direction inclined from a front surface (upper surface) BSf of the substrate BS as similar to the first comparative example.

Figure 21:
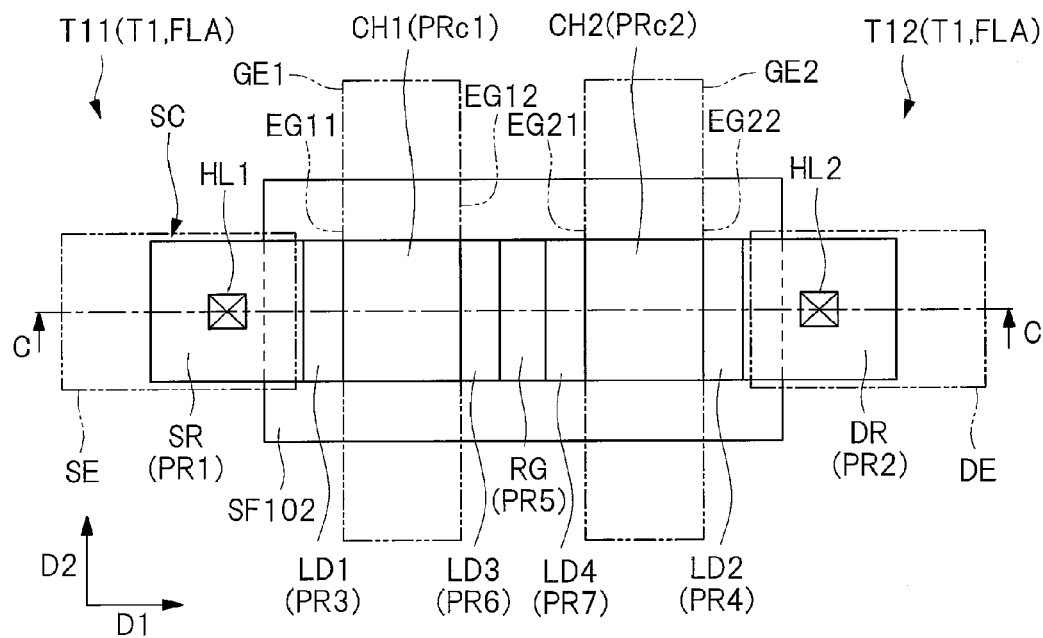
FIG. 21 is a plan view of a transistor and a light shielding film in a fourth comparative example.
Figure 22:
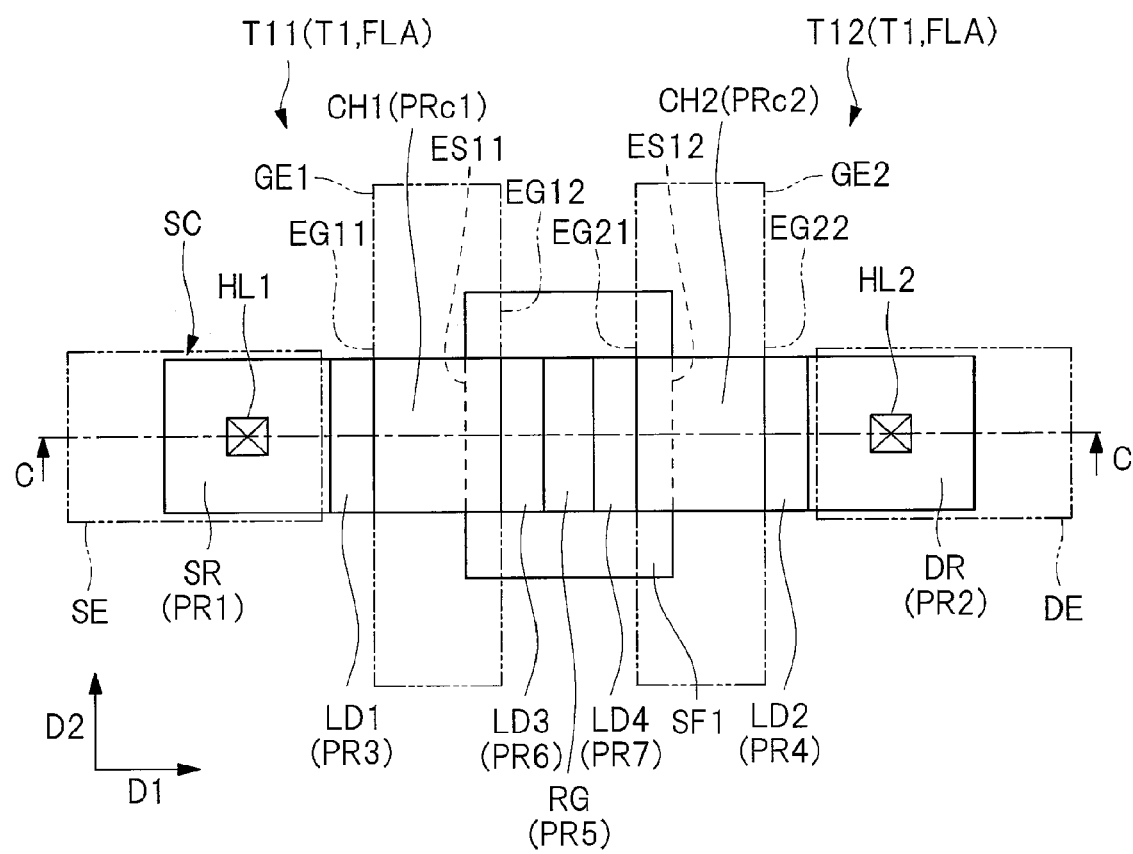
FIG. 22 is a plan view of a transistor and a light shielding film in a modification example of the second embodiment.

Arrangement of Transistor and Light Shielding Film in Fourth Comparative Example Next, an arrangement of a transistor and a light shielding film in a frame region in a fourth comparative example will be described. FIG. 21 is a plan view of a transistor and light shielding film in the fourth comparative example. FIG. 21 illustrates a transparently-viewed state in which the portions except for the semiconductor layer SC and the light shielding film 102 are removed, and illustrates gate electrodes GE1 and GE2, a source electrode SE, and a drain electrode DE by a two-dot and dash line.

As illustrated in FIG. 21, the transistor T1 is also provided above a frame region FLA in a substrate BS also in the fourth comparative example as similar to the third comparative example. The transistor T1 is formed of a thin film transistor, and includes the semiconductor layer SC, a gate insulating film GI (see FIG. 19), the gate electrodes GE1 and GE2, the source electrode SE, and the drain electrode DE.

Also, in the fourth comparative example, the light shielding film SF102 is provided between the transistor T1 and the substrate BS as similar to the second comparative example. Therefore, in the fourth comparative example, light from a backlight (whose illustration is omitted) incident from the back surface (lower surface) BSb side of the substrate BS illustrated in FIG. 19 is blocked by the light shielding film SF102. In the fourth comparative example, all of the end EG11 of the gate electrode GE1 which is on the source region SR side, the end EG12 of the gate electrode GE1 which is on the drain region DR side, the end EG21 of the gate electrode GE2 which is on the source region SR side, and the end EG22 of the gate electrode GE2 which is on the drain region DR side are arranged on the light shielding film SF102.

However, the inventors of the present application have found a problem in which a threshold voltage Vth of the transistor T1 is more shifted toward the negative side in the fourth comparative example in which the light shielding film SF102 is provided than the third comparative example in which no light shielding film is provided. Therefore, in the fourth comparative example, the quality of an image displayed on the display region DPA is reduced.

Principal Characteristic and Effect in Present Embodiment

On the other hand, in the present second embodiment, the light shielding film SF1 is provided between the transistor T1 and the substrate BS. The light shielding film SF1 overlaps the semiconductor layer SC and overlaps the gate electrode GE1 or the gate electrode GE2 when seen in a plan view. Any one of the end EG11 of the gate electrode GE1 which is on the source region SR side, the end EG12 of the gate electrode GE1 which is on the drain region DR side, the end EG21 of the gate electrode GE2 which is on the source region SR side, and the end EG22 of the gate electrode GE2 which is on the drain region DR side is not arranged on the light shielding film SF1.

Thus, even when the width of the frame region FLA is reduced, the transistor T1 arranged in the frame region FLA can be sufficiently shielded from light. The threshold voltage Vth of the transistor T1 arranged in a frame region FLA can also be prevented or suppressed from being more shifted toward the negative side in the case in which the light shielding film is provided between the transistor T1 and the substrate BS than the case in which the light shielding film is not provided between the transistor T1 and the substrate BS.

In the present second embodiment, the transistor T1 includes the two gate electrodes GE1 and GE2 spaced apart from each other between the source region SR and the drain region DR as different from the first embodiment. Therefore, the transistor T1 is formed of the transistor T11 serving as a thin film transistor and the transistor T12 serving as a thin film transistor, which are connected in series with each other. Thus, when the transistor T1 is turned off, electrical connection between the source region SR and the drain region DR can be reliably cut off, and the quality of the image displayed in the display region DPA (see FIG. 1) can be improved.

Preferably, in the present second embodiment, not only the light shielding film SF1 but also the light shielding film SF2, which overlaps the semiconductor layer SC when seen in a plan view, is provided between the transistor T1 and the substrate BS. At this time, the light shielding film SF1 overlaps the gate electrode GE1 but does not overlap the gate electrode GE2 when seen in a plan view, and the light shielding film SF2 overlaps the gate electrode GE2 but does not overlap the gate electrode GE1 when seen in a plan view. The end EG11 of the gate electrode GE1 which is on the source region SR side is arranged on the light shielding film SF1, and the end EG12 of the gate electrode GE1 which is on the drain region DR side is not arranged on the light shielding film SF1. The end EG21 of the gate electrode GE2 which is on the source region SR side is not arranged on the light shielding film SF2, and the end EG22 of the gate electrode GE2 which is on the drain region DR side is arranged on the light shielding film SF2.

In other words, an end ES11 of the light shielding film SF1 which is on the source region SR side is not arranged below the gate electrode GE1, and an end ES12 of the light shielding film SF1 which is on the drain region DR side is arranged below the gate electrode GE1. An end ES21 of the light shielding film SF2 which is on the source region SR side is arranged below the gate electrode GE2, and an end ES22 of the light shielding film SF2 which is on the drain region DR side is not arranged below the gate electrode GE2.

Thus, even when the width of the frame region FLA is reduced, the transistor T1 arranged in the frame region FLA can be further sufficiently shielded from light. The threshold voltage Vth of the transistor T1 arranged in a frame region FLA can also be prevented or suppressed from being more shifted toward the negative side in the case in which the light shielding film is provided between the transistor T1 and the substrate BS than the case in which the light shielding film is not provided between the transistor T1 and the substrate BS.

Furthermore, preferably, the semiconductor region LD1 is arranged in a region where the light shielding film SF1 is formed when seen in a plan view, and the semiconductor region LD2 is arranged in a region where the light shielding film SF2 is formed when seen in a plan view. In such a case, a transistor characteristic can be further reliably prevented or suppressed from varying due to the incidence of light from the backlight into the semiconductor regions LD1 and LD2.

Alternatively, preferably, each of the light shielding films SF1 and SF2 is not electrically connected to, for example, other wirings, and is in an electrically floating state. Thus, the number of processes for manufacturing the display device can be reduced as similar to the first embodiment. Even when each of the plurality of pixels provided in the display device is finely formed and when the number of the pixels provided in the display device is large, each of the light shielding films SF1 and SF2 is not electrically connected to the other wirings, so that the display device can be easily manufactured.

What is claimed is:

1. A display device comprising:
   a transparent substrate including a first region and a second region provided outside the first region;
   a plurality of pixels provided in the first region in the transparent substrate;
   a thin film transistor provided in the second region in the transparent substrate; and
   a first light shielding film provided between the thin film transistor and the transparent substrate,
   wherein the thin film transistor includes:
   a semiconductor layer formed above the second region in the transparent substrate; and
   a first gate electrode and a second gate electrode formed above or below the semiconductor layer via a gate insulating film,
   the first gate electrode and the second gate electrode are spaced apart from each other when seen in a plan view,
   the semiconductor layer includes:
   a source region formed in a first portion of the semiconductor layer which is positioned on an opposite side to the second gate electrode across the first gate electrode when seen in a plan view; and
   a drain region formed in a second portion of the semiconductor layer which is positioned on an opposite side to the first gate electrode across the second gate electrode when seen in a plan view,
   the first light shielding film overlaps the semiconductor layer and overlaps the first gate electrode or the second gate electrode when seen in a plan view, and
   any one of a first end of the first gate electrode which is on the source region side, a second end of the first gate electrode which is on the drain region side, a third end of the second gate electrode which is on the source region side, and a fourth end of the second gate electrode which is on the drain region side is not arranged on the first light shielding film.

2. The display device according to claim 1, comprising a second light shielding film provided between the thin film transistor and the second region in the transparent substrate,
   wherein the first light shielding film overlaps the first gate electrode but not overlap the second gate electrode,
   the second light shielding film overlaps the second gate electrode but not overlap the first gate electrode, the first end of the first gate electrode is arranged on the first light shielding film, the second end of the first gate electrode is not arranged on the first light shielding film, the third end of the second gate electrode is not arranged on the second light shielding film, and the fourth end of the second gate electrode is arranged on the second light shielding film.

3. The display device according to claim 1, wherein a fifth end of the first light shielding film which is on the source region side is arranged below the first gate electrode, and a sixth end of the first light shielding film which is on the drain region side is arranged below the second gate electrode.

4. The display device according to claim 2, wherein the semiconductor layer includes:

a first semiconductor region formed in a third portion of the semiconductor layer which is positioned between the first gate electrode and the source region when seen in a plan view; and a second semiconductor region formed in a fourth portion of the semiconductor layer which is positioned between the second gate electrode and the drain region when seen in a plan view, the source region is formed by introducing impurities of a first conductivity type into the first portion of the semiconductor layer, the drain region is formed by introducing impurities of a first conductivity type into the second portion of the semiconductor layer, the first semiconductor region is formed by introducing the impurities of the first conductivity type into the third portion of the semiconductor layer, the second semiconductor region is formed by introducing the impurities of the first conductivity type into the fourth portion of the semiconductor layer, a concentration of the impurities of the first conductivity type in the first semiconductor region is lower than a concentration of the impurities of the first conductivity type in the source region, and a concentration of the impurities of the first conductivity type in the second semiconductor region is lower than a concentration of the impurities of the first conductivity type in the drain region.

5. The display device according to claim 4, wherein the first semiconductor region is arranged in a region where the first light shielding film is formed when seen in a plan view, and the second semiconductor region is arranged in a region where the second light shielding film is formed when seen in a plan view.

6. The display device according to claim 2, wherein each of the first light shielding film and the second light shielding film is formed of a metal film or an alloy film.

7. The display device according to claim 6, wherein each of the first light shielding film and the second light shielding film is in an electrically floating state.

* * * * *